(12) United States Patent
Setsuhara et al.

(10) Patent No.: US 7,567,037 B2
(45) Date of Patent: Jul. 28, 2009

(54) HIGH FREQUENCY POWER SUPPLY DEVICE AND PLASMA GENERATOR

(75) Inventors: Yuichi Setsuhara, Minoh (JP); Tatsuo Shoji, Nagoya (JP); Masayoshi Kamai, Kobe (JP)

(73) Assignee: Japan Science and Technology Agency, Saitma (JP)

( * ) Notice: Subject to any disclaimer, the term of this patent is extended or adjusted under 35 U.S.C. 154(b) by 470 days.

(21) Appl. No.: 10/542,289

(22) PCT Filed: Jan. 15, 2004

(86) PCT No.: PCT/JP2004/000258

§ 371 (c)(1),
(2), (4) Date: Jul. 15, 2005

(87) PCT Pub. No.: WO2004/064460

PCT Pub. Date: Jul. 29, 2004

(65) Prior Publication Data

US 2006/0057854 A1  Mar. 16, 2006

(30) Foreign Application Priority Data

Jan. 16, 2003 (JP) ............................. 2003-008648

(51) Int. Cl.
*H05H 1/00* (2006.01)
(52) U.S. Cl. .................. 315/111.21; 315/111.51; 118/723 I; 118/723 AN; 156/345.48
(58) Field of Classification Search ............ 315/111.21, 315/111.41, 111.51, 111.61, 111.71; 156/345.48; 118/723 I, 723 AN
See application file for complete search history.

(56) References Cited

U.S. PATENT DOCUMENTS

| 6,181,069 B1 | 1/2001 | Tonotani et al. |
| 6,893,533 B2 * | 5/2005 | Holland et al. ......... 156/345.48 |
| 2002/0007794 A1 * | 1/2002 | Byun et al. ............... 118/723 I |

FOREIGN PATENT DOCUMENTS

JP        62-273731        11/1987

(Continued)

OTHER PUBLICATIONS

Taiwanese Office Action dated Jan. 20, 2006 w/English language translation.
Naoki Yamamoto et al., "Large-Scale Inductively Coupled Plasma Production with Multiple Internal Antennas Units", Journal of High Temperature Society; vol. 28, No. 4, p. 13; Jul. 22, 2002.

(Continued)

*Primary Examiner*—David Hung Vu
(74) *Attorney, Agent, or Firm*—Harness, Dickey & Pierce PLC

(57) ABSTRACT

A high frequency power supplying device and a plasma generation device using the same includes: two or more inductive antennas; high frequency power sources, respectively supplying power to the antennas; and a vacuum chamber on which the antennas are provided so as to generate a plasma by inductive coupling with high frequency power, wherein each of the high frequency power sources is positioned close to a corresponding antenna. On this account, it is possible to reduce unevenness in high frequency voltages generated in the antennas. Thus, even when a diameter and a volume of the plasma generation section are made larger, it is possible to generate much more uniform plasma, thereby stabilizing (i) thin film formation processes based on the plasma and (ii) plasma ion implantation processes.

24 Claims, 23 Drawing Sheets

FOREIGN PATENT DOCUMENTS

| | | |
|---|---|---|
| JP | 08-236294 | 9/1996 |
| JP | 09-270299 | 10/1997 |
| JP | 11-317299 | 11/1999 |
| JP | 2001-35697 A | 2/2001 |
| JP | 2001-321662 | 11/2001 |
| JP | 2002-012977 | 1/2002 |
| JP | 2002-359232 | 12/2002 |
| JP | 2003-031504 | 1/2003 |
| KR | 1993-0020608 | 10/1993 |

OTHER PUBLICATIONS

International Search Report & International Preliminary Examination Report.

Korean Office Action dated Oct. 26, 2006 with English language translation.

* cited by examiner

16 ANTENNAS

POSITION OF ANTENNA :1.5cm
x-y DISTRIBUTION OF PLASMA DENSITY :z=−10cm
x DISTRIBUTION OF PLASMA DENSITY :y=(123/2−8)cm, z=−10cm

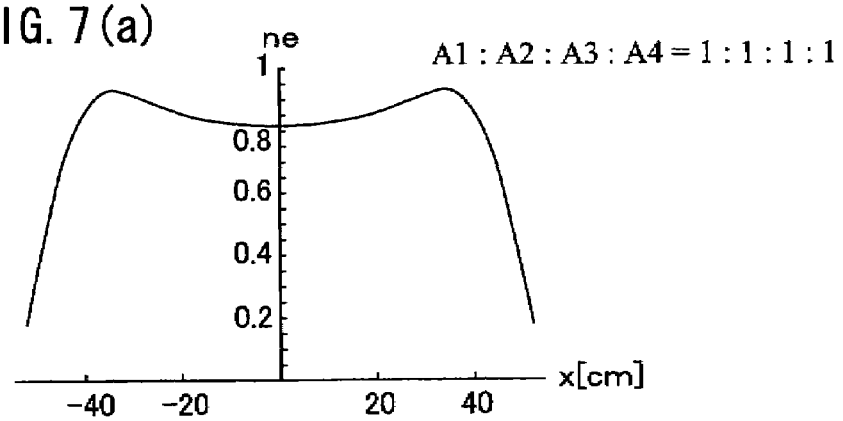
FIG. 7(a)  A1 : A2 : A3 : A4 = 1 : 1 : 1 : 1
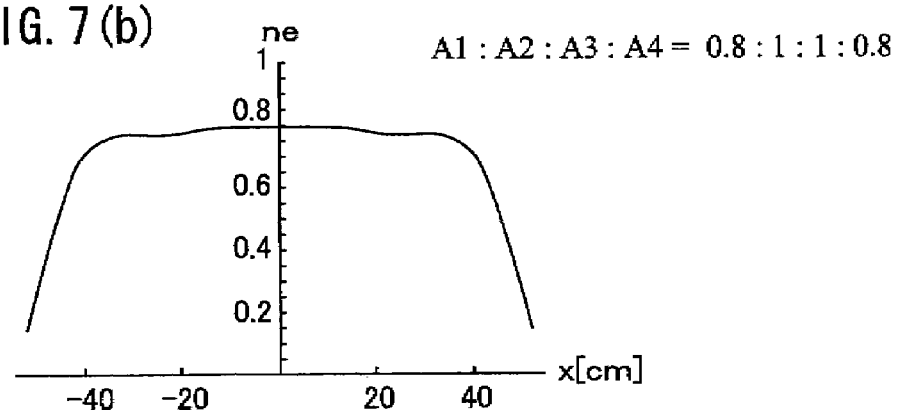
FIG. 7(b)  A1 : A2 : A3 : A4 = 0.8 : 1 : 1 : 0.8
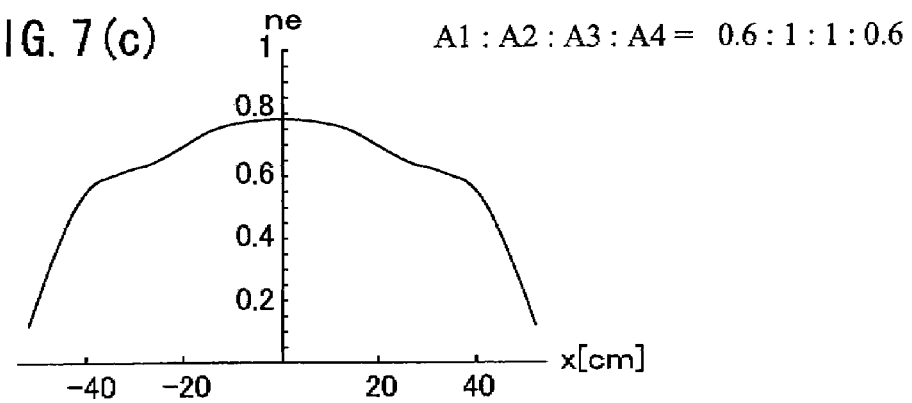
FIG. 7(c)  A1 : A2 : A3 : A4 = 0.6 : 1 : 1 : 0.6

GROUNDING SIDE    POWER SUPPLYING SIDE

HIGH FREQUENCY POWER SUPPLY DEVICE AND PLASMA GENERATOR

TECHNICAL FIELD

The present invention is related to a high frequency power supplying device and a plasma generation device each of which is suitable for (i) a process in which a thin film is formed especially on a substrate whose area is large and (ii) a process in which ions are implanted onto industrial workpieces with large size as plasma ion implantation.

BACKGROUND ART

An inductively-coupled plasma generation device using high frequency power can generate a highly dense plasma, thereby realizing a high throughput. Thus, such a plasma generation device has been used in (i) a process in which a thin film is formed on a substrate and (ii) a process in which plasma ions are implanted.

In the inductively-coupled plasma generation device using high frequency power, when an amplitude-to-ground of a high frequency voltage applied to at least one antenna becomes large, anomalous discharge tends to occur, and a potential fluctuation of the plasma becomes anomalously large which results in plasma damage. Thus, it is required to decrease the high frequency voltage which occurs between the antenna terminals.

Therefore, as shown in FIG. 25, a conventional art is arranged so that: high frequency power of a high frequency power source 51 is supplied via a high frequency power transmission line (50Ω) 52 and an impedance matcher 53 to antennas 54 serving as plural loads. Further, in the high frequency power source 51, a high frequency signal of an oscillator 55 is amplified by plural amplifiers 56 so as to be collectively outputted as high frequency power by a phase adjuster 57.

In such a mode that high frequency power is supplied to the antennas 54, the inductively-coupled plasma generation device using two or more antennas 54 is arranged so that wiring sections 58 supply high frequency power to the antennas 54 not in series but in parallel connection as shown in FIG. 26 (Japanese Unexamined Patent Publication No. 35697/2001 (Tokukai 2001-35697)).

The reason is as follows: as a result of comparison between a case where high frequency power is supplied to two or more antennas 54 having finite inductances in series with a case where high frequency power is supplied to two or more antennas 54 having finite inductances in parallel, both the cases are identical with each other in that a high frequency voltage which occurs between terminals of the antennas 54 is in proportion to a product obtained by multiplying an inductance of each antenna 54 with a high frequency current, but a synthesized inductance in case of supplying the high frequency power in parallel can be made lower than a synthesized inductance in case of supplying the high frequency power in series.

(Patent Document 1)
Japanese Unexamined Patent Publication No. 35697/2001 (Tokukai 2001-35697) (Publication date: Feb. 9, 2001)

However, in case where the inductively-coupled plasma generation device adopts a conventional mode in which high frequency power is supplied to two or more antennas 54 in parallel, when a plasma generation section is to be arranged so as to have a larger diameter or have a larger volume, the antennas 54 are disposed so as not to be locally located in a plasma generation chamber 59 in order to uniformly generate plasmas in a whole large area or a whole large volume. As a result, a distance between the impedance matcher 53 and one of the antennas 54 with the wiring section 58 intervening therebetween becomes larger than a distance between the impedance matcher 53 and each of other antennas 54.

Thus, in the conventional art, a synthesized inductance becomes lower than that in the case where the high frequency power is supplied in series, but the wiring section 58s inductance required in supplying the high frequency power to the antennas 54 in parallel increases with increasing size in diameter or volume of the plasma generation section. This raises such a problem that: a higher frequency voltage than a high frequency voltage generated between terminals of a single antenna 54 occurs in an antenna 54 connected to an end portion.

Further, in the plasma generation device using a conventional high frequency power supplying mode, shown in FIG. 26, in which high frequency currents are supplied to two or more antennas 54 in parallel, a high frequency current flowing to each antenna 54 is shunted, in a point between the impedance matcher 53 and the antenna 54 serving as a load, by a receiving circuit. Thus, unevenness in the impedances which are parasitic in this shunt circuit results not only in nonuniform current distribution but also in a condition under which it is impossible to positively control the current distribution.

This conventional art raises such a problem that: even when (i) a loading resistance of a plasma, (ii) unevenness in the impedances which are parasitic in the shunt circuit, and (iii) a temporal change which results from a generated heat cause a high frequency currents flowing in the antennas 54 to be nonuniform, it is impossible to control the high frequency current, so that plasma generation becomes nonuniform and unstable which results in unstable formation of a thin film using the plasma or a similar disadvantage.

Further, the plasma generation device using a conventional high frequency power supplying mode, shown in FIG. 26, in which a high frequency current is supplied to two or more antennas 54 in parallel raises such a problem similar to the foregoing problem that: it is possible to perform impedance matching with respect to a synthesized impedance of plural antennas 54 connected in parallel, but it is impossible to independently control a condition under which the impedance matching is performed with respect to a high frequency current supplied to each antenna 54, so that plasma generation becomes nonuniform and unstable which results in unstable formation of a thin film using a plasma or a similar disadvantage.

Further, the conventional art also raises such a problem similar to the foregoing problem that: there occurs sputtering of the antenna which is caused by a high frequency voltage applied to a sheath region in a generated plasma and the sputtering significantly abrades the antenna, so that plasma generation becomes nonuniform and unstable which results in unstable formation of a thin film using a plasma or a similar disadvantage. Also, there occurs such a problem that impurities are generated by the sputtering.

DISCLOSURE OF INVENTION

In order to solve the foregoing problems, a high frequency power supplying device of the present invention, having two or more loads which are capacitive or inductive, includes high frequency power sources for supplying power to the loads, wherein each of the high frequency power sources is provided in proximity to a corresponding load.

Therefore, the foregoing arrangement does not require high frequency currents to be supplied to the loads in parallel or in series, so that it is possible to reduce unevenness in high frequency voltages generated in the loads.

In order to solve the foregoing problems, a plasma generation device of the present invention includes: the aforementioned high frequency power supplying device; and a vacuum chamber on which the loads are provided, wherein the high frequency power is applied to the loads so as to generate a plasma in the chamber.

Therefore, the foregoing arrangement does not require high frequency currents to be supplied to the loads in parallel or in series, so that it is possible to reduce unevenness in high frequency voltages generated at the loads. Thus, even when a plasma generation section is arranged so as to have a larger diameter or a larger volume, it is possible to generate much more uniform plasmas, so that it is possible to stabilize formation of a thin film using the plasma and plasma ion implantation processes.

For a fuller understanding of the nature and advantages of the invention, reference should be made to the ensuing detailed description taken in conjunction with the accompanying drawings.

BRIEF DESCRIPTION OF DRAWINGS

FIG. 5(a) shows a condition under which phases are adjusted in a single direction. FIG. 5(b) shows a condition under which phases are adjusted in directions opposite to each other.

FIG. 7(a) to FIG. 7(c) are graphs each showing a condition under which plasma uniformity in the vacuum chamber changes when distribution of high frequency powers supplied to each antenna conductor is changed in the plasma generation device of the present invention shown in FIG. 6. FIG. 7(a) shows a case where the same power is supplied to the four antenna conductors of each side face. FIG. 7(b) shows a case where the high frequency power supplied to antenna conductors in both ends of each side face is made lower by 20% than that of two other antenna conductors. FIG. 7(c) shows a case where the high frequency power supplied to antenna conductors in both ends of each side face is made lower by 40% than that of two other antenna conductors.

FIG. 8(a) shows a case where one end of the antenna conductors is grounded. FIG. 8(b) shows a case where both ends of the antenna conductors are at a floating potential due to a blocking capacitor or the like.

FIG. 16(a) is a top view. FIG. 16(b) is a front view. FIG. 16(c) is a perspective view.

FIG. 18(a) is a cross sectional view. FIG. 18(b) is a perspective view.

FIG. 21(a) shows plasma density as the plasma condition. FIG. 21(b) shows an electron temperature as the plasma condition. FIG. 21(c) shows a plasma potential as the plasma condition.

FIG. 24(a) shows plasma density as the plasma condition. FIG. 24(b) shows an electron temperature as the plasma condition. FIG. 24(c) shows a plasma potential as the plasma condition.

BEST MODE FOR CARRYING OUT THE INVENTION

The present invention is further detailed in the following embodiments. However, the present invention is not limited to them at all.

Embodiments of the present invention are described below with reference to FIG. 1 to FIG. 25.

EMBODIMENT 1

Figure 1:
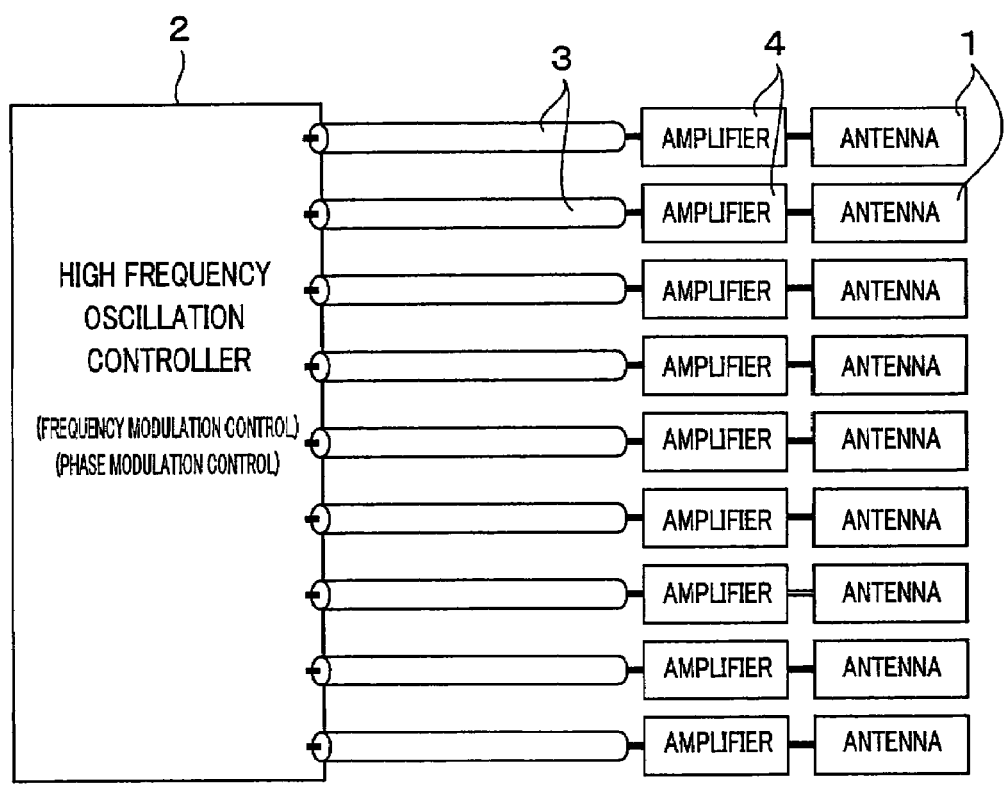
FIG. 1 is a circuit block diagram of a high frequency power supplying device of the present invention.

As shown in FIG. 1, a high frequency power supplying device according to one embodiment of the present invention includes: a plurality of antennas 1 serving as loads; a high frequency oscillation controller (power control section, plasma control section) 2 for supplying high frequency power to each of the antennas 1; and a high frequency signal transmission distribution constant line 3 for supplying a high frequency signal for the high frequency power to each of the antennas 1. A property impedance of the distribution constant line 3 is set to 50Ω.

Further, in the high frequency power supplying device, amplifiers 4 each amplifying the high frequency signal so as to supply thus amplified frequency signal to the antenna 1 are provided so as to be respectively positioned in proximity to corresponding antennas 1. On this account, even when two or more antennas 1 are provided, it is possible to unify voltages generated by the high frequency power supplied to the antennas 1, and it is possible to stabilize plasma generation due to inductively-coupled of the antennas 1.

Note that, in the foregoing description, the antennas 1 are set so as to serve as inductive loads, but may be set so as to serve as capacitive loads. The antenna 1 has any shape as long as it is possible to generate a plasma by serving as the inductive load or as the capacitive load. In case of the inductive load, it is possible to form the antenna 1 into a semicircular shape or a substantially three-sided shape with a single turn (the number of times a wire is rolled), preferably less than a single turn, in order to realize a lower inductance.

Figure 2:
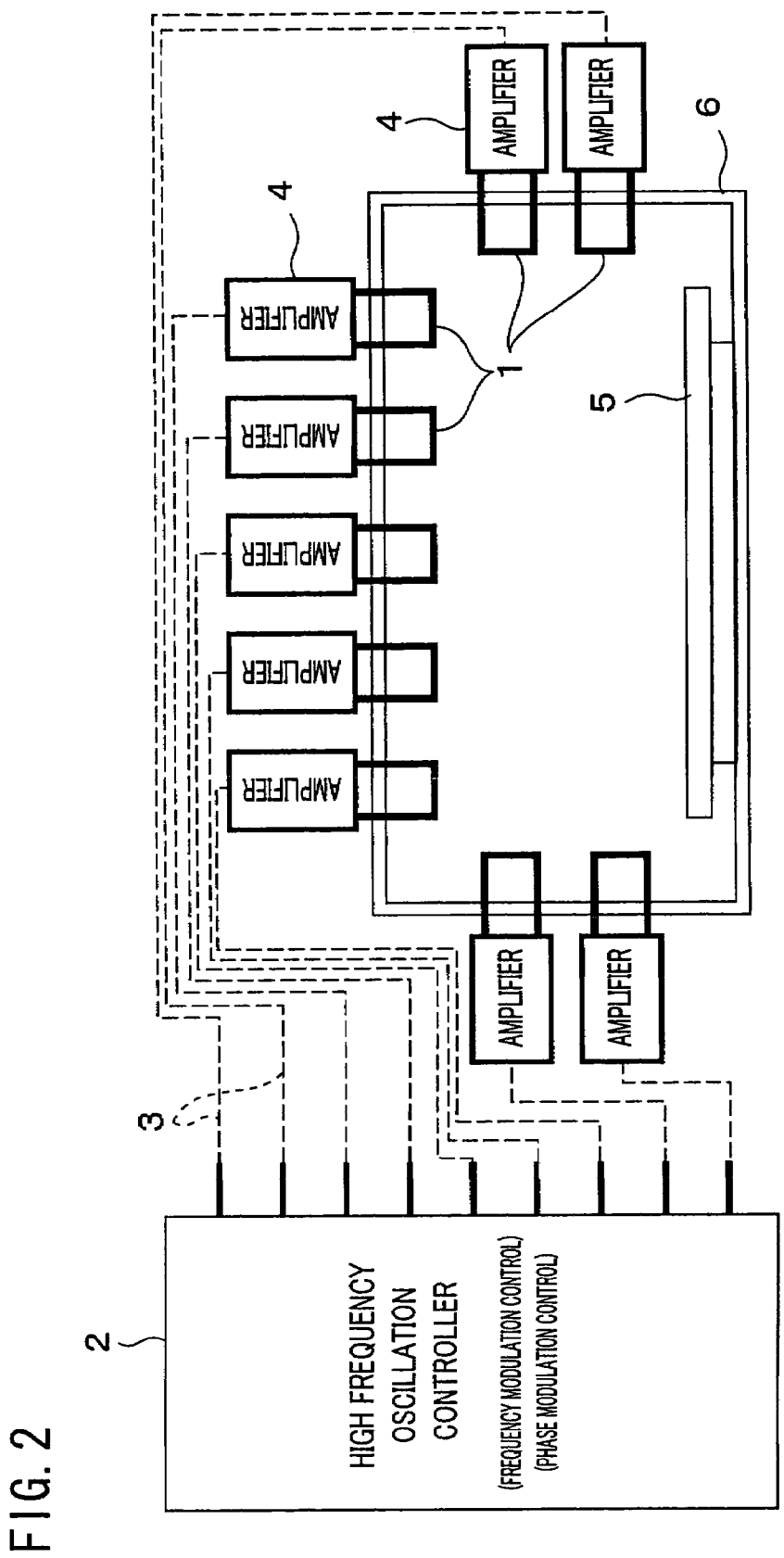
FIG. 2, showing an arrangement of a plasma generation device of the present invention, is a cross sectional view of the plasma generation device in which a plurality of inductively-coupled antennas are connected to the high frequency power supplying device of the present invention.

As shown in FIG. 2, the plasma generation device of the present invention includes the high frequency power supplying device, wherein the antennas 1, provided in the vacuum chamber 6 having a substrate stage 5 on its bottom surface so as to generate a plasma, which surround the substrate stage 5 and protrude more internally than an internal wall of the vacuum chamber 6 with the antennas 1 positioned adjacent to each other.

Note that, the vacuum chamber 6 has any shape as long as the shape corresponds to a shape of a substrate targeted in formation of a thin film or a similar process, for example rectangular parallelepiped shape or columnar shape. Further, although not shown, the vacuum chamber 6 has a plasma generation gas inlet and a vacuum pump outlet used to control a pressure in the vacuum chamber 6, and further has a gas supplying section and a vacuum pump. Moreover, a target installation section for sputtering or the like may be provided in the vacuum chamber 6.

Figure 3:
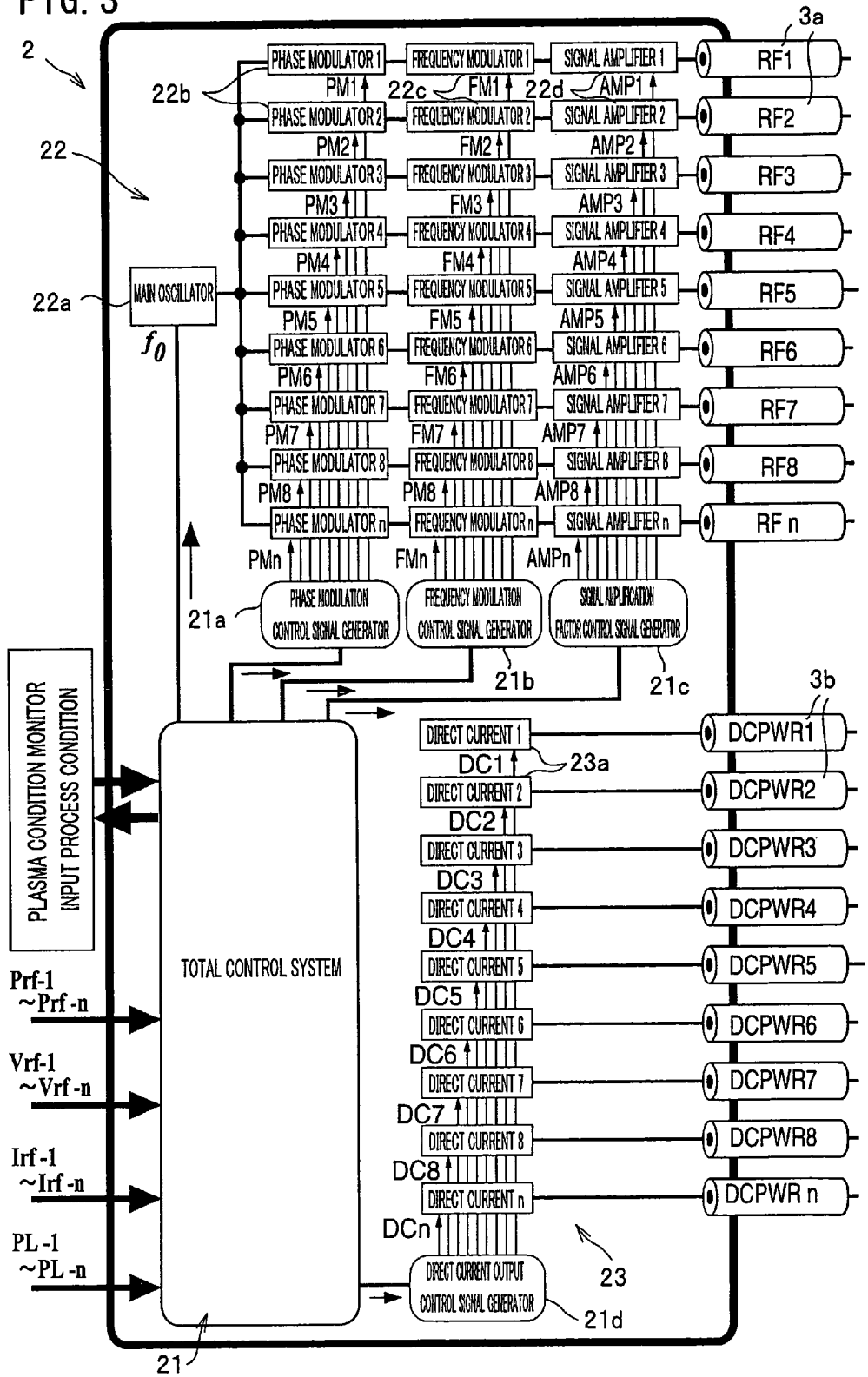
FIG. 3 is a circuit block diagram of a high frequency oscillation controller of the high frequency power supplying device.

As shown in FIG. 3, the high frequency oscillation controller 2 includes a total control system 21, a high frequency circuit system 22, and a direct current power source system 23. The high frequency circuit system 22 is characterized in: (1) there are provided plural phase modulators (phase control sections) 22b, plural frequency modulators (frequency control sections) 22c, and plural signal amplifiers 22d, all of which are connected to a single main oscillator (oscillation frequency: fO) 22a; (2) the outputted high frequency signal is outputted from a high frequency output terminal connected to each high frequency circuit system 22, and is inputted to each amplifier 4 connected to the high frequency output terminal via a high frequency line 3a of the distribution constant line 3; and (3) the phase modulator 22b, the frequency modulator 22c, and the signal amplifier 22d, all of which constitute the high frequency circuit system 22, enable power, a frequency, and a phase of the high frequency signal outputted from the high frequency circuit system 22 to be respectively controlled.

The direct current power source system 23 is characterized in: (1) a plurality of current sources 23a are provided; (2) each direct current voltage outputted from the direct current power source system 23 is outputted via a direct current output terminal connected to each direct current power source 23a, and is inputted to the amplifier 4 connected to the direct current output terminal via a direct current line 3b of the distribution constant line 3; and (3) the direct current power outputted from each direct current power source 23a can be controlled.

The total control system 21 receives, as input signals, (i) measurement signals of a high frequency voltage, a current, and power, which are supplied to the antenna 1 serving as a load in each unit and (ii) measurement signals (Prf-1 to Prf-n, Vrf-1 to Vrf-n, Irf-1 to Irf-n, PL-1 to PL-n) from a measuring circuit (measuring section) for measuring and diagnosing a condition of plasma generation (plasma density, electron temperature, plasma potential, or the like) in a vicinity of a load provided in each unit.

The total control system 21 includes a phase modulation control signal generator 21a, a frequency modulation control signal generator 21b, a signal amplification ratio control signal generator 21c, and a direct current output control signal generator 21d, for performing feedback control with respect to outputs of the high frequency circuit system 22 and the direct current power source system 23 so that a desired process condition is satisfied by using signals as control signals indicative of (i) a high frequency voltage, (ii) a current, (iii) power, and (iv) a plasma condition, all of which are inputted from each amplifier 4 to a total control system 21.

The phase modulation controlling signal generator 21a controls each phase modulator 22b. The frequency modulation controlling signal generator 21b controls each frequency modulator 22c. The signal amplification ratio control signal generator 21c controls each signal amplifier 22d. The direct current output control signal generator 21d controls each direct current source 23a.

Due to the feedback control, the total controlling system 21 can keep a stable and highly reproducible condition in a process device.

As a characteristic (4), the plasma generation device controls plasma uniformity and realizes a stable and highly reproducible condition so as to output the condition in a monitor showing a plasma condition which is a sequence of process conditions.

Further, by comparing high frequency power, a voltage, and a current in the antenna conductor of the antenna 1 with a plasma condition (on the basis of an intensity ratio, a phase difference), it is possible to estimate a quantity of substances adhering around the antenna 1.

Specifically, as a ratio at which the adhering substances absorb and shield the high frequency magnetic field becomes higher, an intensity ratio of the high frequency magnetic field with respect to high frequency antenna current, Irf, becomes lower. Thus, by monitoring the plasma condition with respect to Irf, it is possible to estimate a quantity of substances adhering around the antenna 1, so that it is possible to surely estimate a time in which a vicinity of the antenna 1 should be cleaned with appropriate etching gas or the antenna 1 should be replaced with a new antenna 1.

In this manner, the monitor processes a feedback input signal (signals such as (i) a high frequency voltage, (ii) a high frequency current, both of which are supplied to the antenna, (iii) a phase of the high frequency current, and (iv) a high frequency magnetic field intensity, and signals from the measuring sections) inputted to the total control system 21, so as to output the plasma condition and a shield condition in a vicinity of the antenna so that the conditions are monitored.

Meanwhile, in the conventional art, it is necessary to perform cleaning or replacement based on a trial-and-error empirical rule, so that operation of the antenna may be destabilized.

Figure 4:
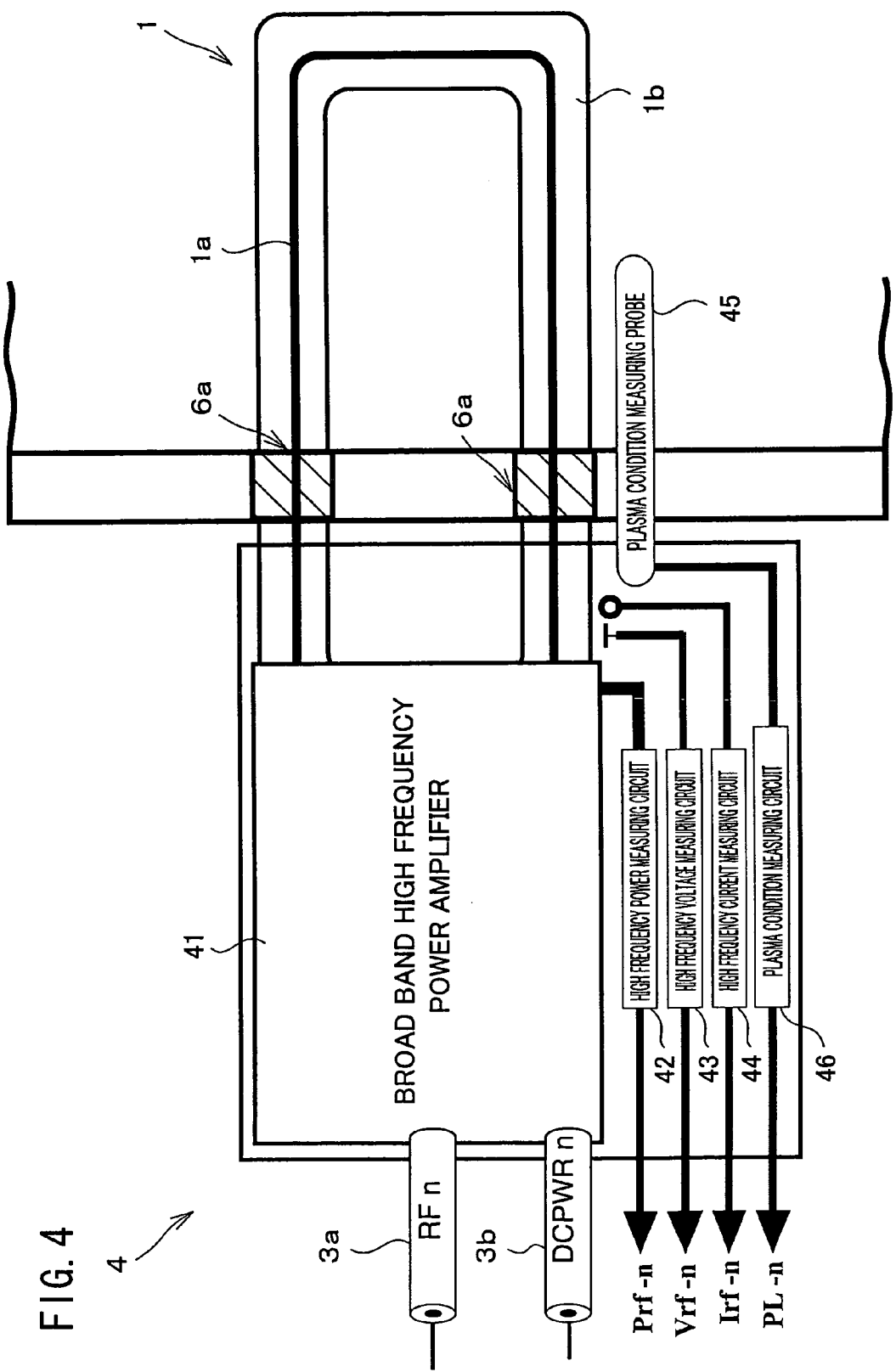
FIG. 4 is a circuit block diagram of an amplifier (high frequency amplifier integrated unit) which is an essential portion of the plasma generation device.

The aforementioned amplifier 4, as shown in FIG. 4, includes a high frequency power amplifier 41 in which a high frequency power amplifying element (MOSFET) is installed on a water-cooled Cu base. The high frequency power amplifier 41 is connected to the antenna 1, having a lower impedance, via a vacuum flange and a high frequency field through (insulator) 6a, so that the amplifier 4 functions as a high frequency amplifier integrated unit. The antenna 1 includes: an inductively-coupled antenna conductor 1a; and an antenna insulation section 1b, made of an electric insulator such as ceramic and a material with a low dielectric constant, which covers the antenna conductor 1a.

The amplifier 4 includes: measuring circuits (measuring sections) 42, 43, and 44 for respectively measuring high frequency power (Prf-n), a voltage (Vrf-n), and a current (Irf-n), which are supplied to the antenna conductor 1a; a measuring probe (measuring section) 45 for measuring a plasma condition (PL-n) in the vicinity of the antenna conductor 1a; and a measuring circuit (measuring section) 46 for the probe 45. The measuring probe 45 has a rod shape, and its tip end portion protrudes into the vacuum chamber 6. In measuring the plasma condition, it is possible to use a high frequency magnetic field probe, a Langmuir probe, an ion collector, a plasma absorption probe, and an optical emission spectroscopy probe, which are used to measure a high frequency magnetic field intensity around the antenna.

A high frequency signal, inputted from the high frequency oscillation controller 2, whose maximum power is 10 W, is inputted to a C-class amplification circuit in the amplifier 4, and the power is amplified into high frequency power due to a driving current supplied from the direct current power source 23a to the MOSFET. The high frequency power is outputted directly to the inductively-coupled antenna conductor 1a having a low impedance, and a passive circuit performs impedance matching between the antenna conductor 1a and the amplifier 4.

The high frequency power supplied to the antenna conductor 1a corresponds to a product obtained by multiplying a high frequency signal supplied from the high frequency oscillation controller 2 with an amplification ratio of the amplifier 4. The amplification ratio depends on (i) an inputted high frequency signal, (ii) a frequency thereof, and (iii) direct current power supplied to the amplifier 4.

Thus, the high frequency power supplied to the antenna conductor 1a is controlled in accordance with (i) a high frequency signal supplied from the high frequency oscillation controller 2 to the amplifier 4, (ii) a frequency thereof, and (iii) direct current power.

Specifications of the amplifier 4 are as follows.
Amplification circuit: a push-pull high frequency power amplification circuit
Cost: US$0.25/W
Amplification frequency band: 2 to 50 MHz
Direct current input voltage: 50V
Direct current input current: 40 A to 50 A
High frequency input power: up to 10 W
High frequency output power: 1 kW (when 10 W is inputted)

Effects of the present invention are described below.
1) Power, a frequency, a phase, and direct current power of a high frequency signal supplied from the high frequency oscillation controller 2 to the amplifier 4 are controlled, so that high frequency power can be independently supplied to each antenna conductor 1a, and impedance matching conditions of the frequency, the power, and the phase with respect to loads can be positively controlled.
(A Frequency, Power, and a Phase Can Be Respectively Controlled)
2) Unlike the conventional art which requires a shunt circuit, the present invention requires no shunt circuit for causing a passive circuit to shunt a high frequency current between an impedance matcher and an antenna (load), so that it is possible to avoid nonuniform current distribution caused by unevenness in impedances which are parasitic in the shunt circuit.
3) In generating a plasma having a large area or a large volume, it is possible to additionally provide an antenna 1, serving as a load, without any increase in an inductance which is caused by a larger wiring between the impedance matcher and the load.
(Generation of an RF High Voltage Caused By an Inductance of the Wiring Section Can Be Avoided)
4) It is possible to connect an output section of the high frequency power amplifier 41 directly to the antenna 1 via a concentrated-constant circuit having a low impedance (unlike the conventional art, it is not necessary to provide a matching circuit with respect to a 50Ω transmission line).

Figure 5A:
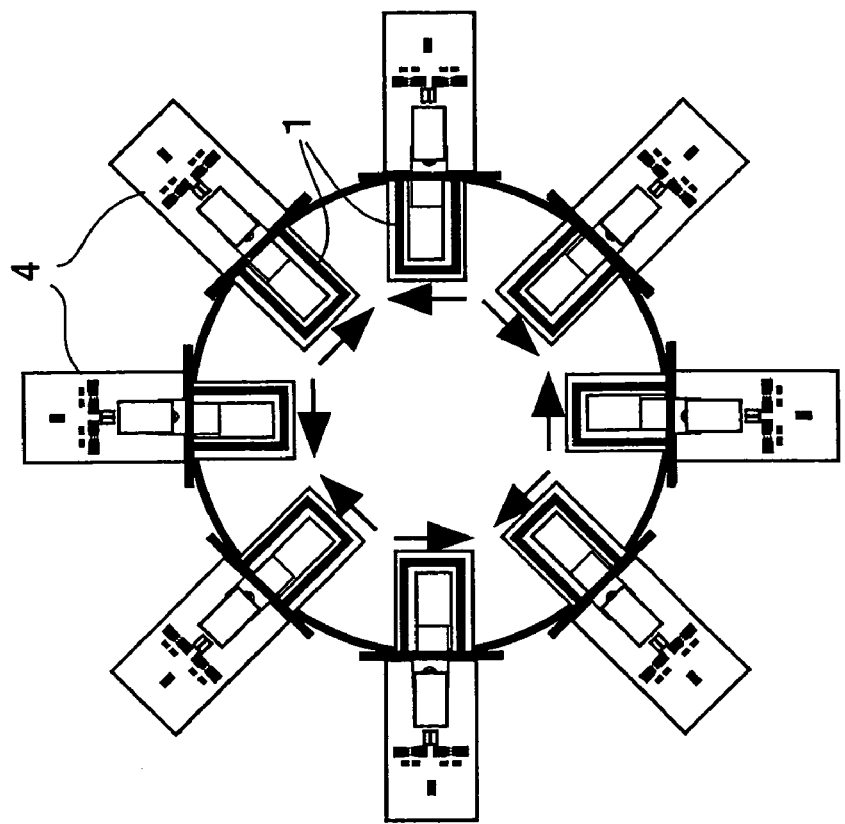
FIG. 5(a) and FIG. 5(b) are schematics each of which shows a condition of the plasma generation device under which phases of high frequency currents supplied to a plurality of antenna conductors are changed.
Figure 5B:
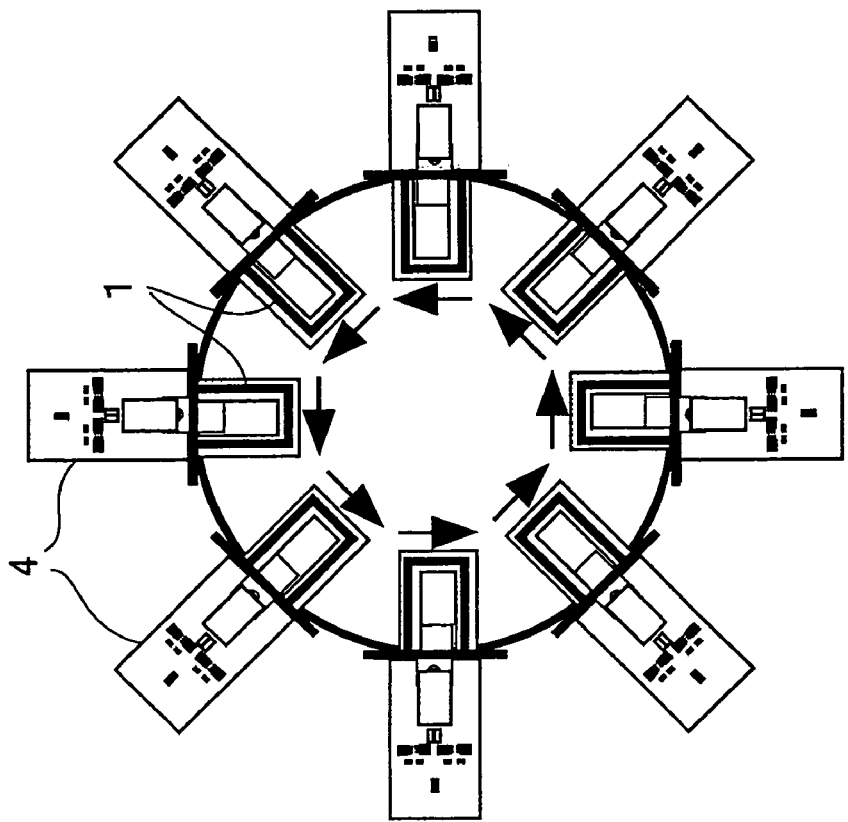

5) It is possible to easily realize a higher output and lower cost (⅓ or less compared with the conventional art) by performing plural installations. Particularly, it is possible to supply RF power in a new mode in generation of a multi-antenna ICP (Inductively Coupled Plasma).
Phase Controlling Effect
As shown in FIG. 5(a) and FIG. 5(b), a phase of an inputted RF signal supplied to each ICP module is controlled, so that an effective accelerating potential of electrons which is determined in accordance with a phase relation between units adjacent to each other. The accelerating potential of electrons is changed, thereby controlling electron energy distribution function in the plasma.

Particularly, a dissociation process, an ionization process, and an excitation process of a process gas used in plasma CVD and plasma etching depend on collision between electrons in the plasma and the process gas, and electron energy distribution function in the plasma is controlled so as to control (i) a ratio of a neutral radical and ionic species and (ii) an excitation condition. Further, a surface reaction and a gas phase reaction depend on (i) the ratio of a neutral radical and ionic species and (ii) the excitation condition, so that it is possible to control a process such as the plasma CVD and the plasma etching or the like so as to realize a desired condition.

Figure 6:
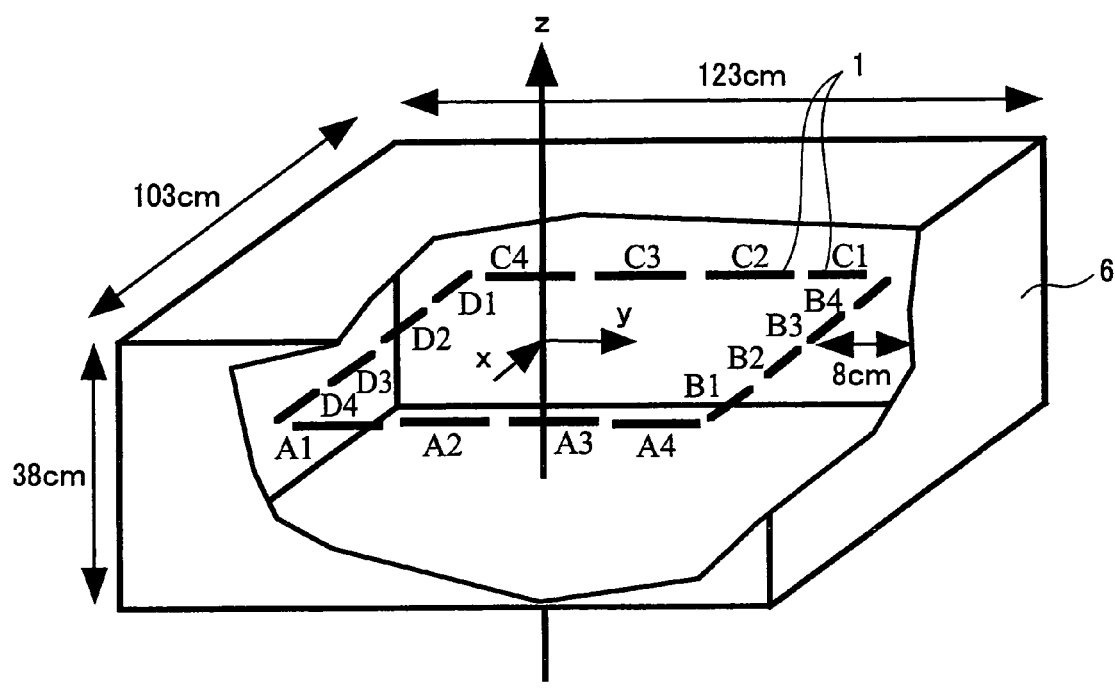
FIG. 6 shows an example where the plasma generation device is arranged as an inductively-coupled type in which four antenna conductors are disposed on each side face of a rectangular vacuum chamber, and shows a schematic perspective view thereof.

An Example of Plasma-Density Distribution Control As to the distribution control, the following description explains Embodiment 1 using the plasma generation device, shown in FIG. 6, which is provided with the vacuum chamber 6 whose internal wall has a substantially rectangular shape.
Planar shape: Cross sectional surface in a horizontal direction is rectangle (oblong)
Longer side: 123 cm, Shorter side: 103 cm, Height: 38 cm Antennas 1 are internally disposed on each of internal walls of the vacuum chamber 6.

Four antennas are disposed on each of two longer sides: (A1, A2, A3, and A4) and (C1, C2, C3, and C4).

Four antennas are disposed on each of two shorter sides: (B1, B2, B3, and B4) and (D1, D2, D3, and D4).

In the vacuum chamber 6, a height direction is a "z" axis, and a planar surface includes an "x" axis and a "y" axis.

An original point of the "z" axis is a central position in the height direction.

An original point of an "x-y" face is a central position of the planar surface.

A position of the antenna 1a: Z=1.5 cm

Simulation Result of Plasma Distribution

FIG. 7 shows "x" distribution of the plasma density under such condition that y=52 cm.

Binding condition under which the simulation is performed (high frequency power is supplied): Both ends in each surface are identical with each other in terms of power supplied, and also other two ends of each surface are identical with each other in terms of power supplied.

In case where power is supplied to four ends of each surface so that the four ends are identical with each other in terms of the power, as shown in FIG. 7(*a*), this results in such nonuniform distribution that density in both ends of each surface becomes too high due to overlap of faces adjacent to each other.

The high frequency power supplied to antenna conductors in both ends of each surface is made lower by 20% than that of two other antenna conductors, thereby obtaining distribution having favorable uniformity as shown in FIG. 7(*b*).

The high frequency power supplied to antenna conductors in both ends of each surface is made lower by 40% than that of two other antenna conductors, so that this results in such nonuniform distribution that density in both ends of each surface becomes too low as shown in FIG. 7(*c*).

In Embodiment 1, the antenna conductors 1a provided on the antennas 1 so as to have substantially three-sided shapes are as follows: a virtual line connecting end portions thereof (portions which are substantially parallel to the internal wall of the vacuum chamber 6) is a closed curve, and the closed curve is set to be larger than a surface shape of a target substrate and to be substantially parallel to the surface shape as a similar shape, and intervals of the antenna conductors 1a adjacent to each other in the virtual line are set to be substantially equal to each other.

In Embodiment 1 arranged in this manner, when the high frequency power supplied to each antenna conductor 1a is independently controlled, so that it is possible to intentionally control distribution of plasmas generated in the vacuum chamber 6.

Further, not only in Embodiment 1 arranged so that the antennas 1 are provided on the side wall of the vacuum chamber but also in case where the antennas 1 are provided on a top board, high frequency power supplied to an antenna conductor and high frequency power supplied to an adjacent antenna conductor are respectively controlled, so that it is possible to easily control a plasma generated in the vacuum chamber.

EMBODIMENT 2

In case where a high frequency current is supplied to the antenna conductor 1a serving as an inductive load, when one end of the antenna conductor 1a is grounded, as shown in FIG. 8(*a*), a power supplying side oscillates at an amplitude-to-ground determined by (i) an angular frequency (ω) of the high frequency power source and (ii) a product obtained by multiplying an inductance (L) of the antenna 1 with an amplitude (Irf) of the high frequency current, and a floating potential is caused by insertion of a blocking capacitor or the like between the antenna ends and the ground, so that this results oscillation at the amplitude-to-ground indicative of a high frequency voltage equally balanced to that of a counter electrode as shown in FIG. 8(*b*).

In either case, any one of end portions of the antenna conductor 1a indicates a high amplitude-to-ground. The high frequency voltage is applied to the plasma sheath region, so that this results in anomalous fluctuation of a plasma potential due to capacitive coupling with a plasma, and ions in the plasma are accelerated and incident onto the antenna conductor 1a due to a high frequency voltage applied to the sheath region and a phenomenon such as sputtering occurs which results in generation of impurities.

Figure 9:
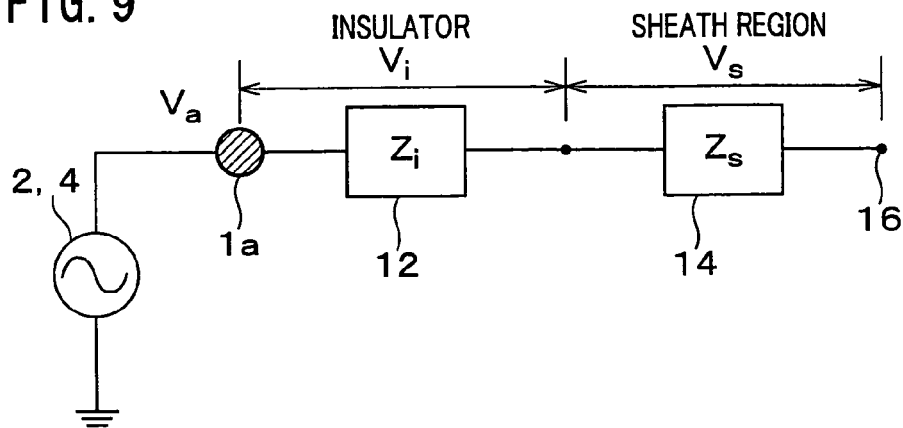
FIG. 9 is a block diagram showing a voltage of each portion provided in a conventional plasma generation device.

In case of a conventional plasma generation device in which an internal surface of the antenna is closely covered with an insulator, as shown by an equivalent circuit of FIG. 9, a voltage (Vs) applied to the plasma sheath region 14 is represented by the following equation (1) using a voltage (Va) generated in the antenna conductor 1a and a potential drop (Vi) in the insulator 12.

$$Vs = Va - Vi = Va \cdot Zs/(Zi+Zs) \quad (1)$$

Here, Zi represents an impedance of the insulator 12, and Zs represents an impedance of the sheath region 14. The surface of the antenna conductor 1a is closely coated with the insulator 12 in this manner, a capacitive coupling component between the antenna 1 and the plasma is suppressed (see Japanese Unexamined Patent Publication No. 35697/2001 (Tokukai 2001-35697).

However, this raises such a problem that impurities are generated due to sputtering of the insulator 12 or dielectrics serving as a coating material.

Figure 10:
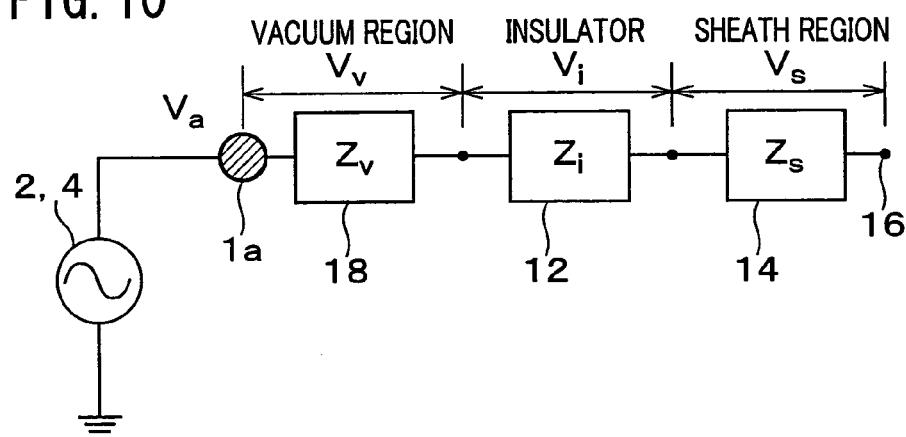
FIG. 10 is a block diagram showing a voltage of each portion provided in a plasma generation device of Embodiment 2 according to the present invention.

As a technical solution for the problem, in order to further decrease the voltage applied to the sheath region 14, a plasma generation device of Embodiment 2 according to the present invention is arranged so that, as shown by an equivalent circuit of FIG. 10, an insulator 12 is disposed around a portion of the antenna conductor 1a which portion exists in the vacuum chamber 6 (more preferably, all portions of the antenna conductor 1a) so that a vacuum region (space region) 18 intervenes therebetween. A degree of vacuum of the vacuum region 18 may be the same as that in the vacuum chamber 6 for generating a plasma.

A dielectric constant of the vacuum region 18 is substantially 1. This is lower than that of any dielectric material. Thus, it is possible to secure a high impedance. Therefore, a voltage (Vs) applied to the plasma sheath region 14 is represented by the following equation (2) using (i) a voltage (Va) generated in the antenna conductor 1a, (ii) a potential drop (Vv) in the vacuum region 18, and (iii) a potential drop (Vi) in the insulator 12.

$$Vs = Va - Vv - Vi = Va \cdot Zs/(Zv+Zi+Zs) \quad (2)$$

Thus, it is possible to further and effectively decrease the high frequency voltage applied to the plasma sheath region 14, compared with the conventional arrangement, by providing the insulator 12 around the antenna conductor 1a so that the vacuum region 18 intervenes therebetween, thereby solving the foregoing problems. In the foregoing equation (2), "Zv" represents an impedance of the vacuum region 18.

EMBODIMENT 3

Figure 8A:
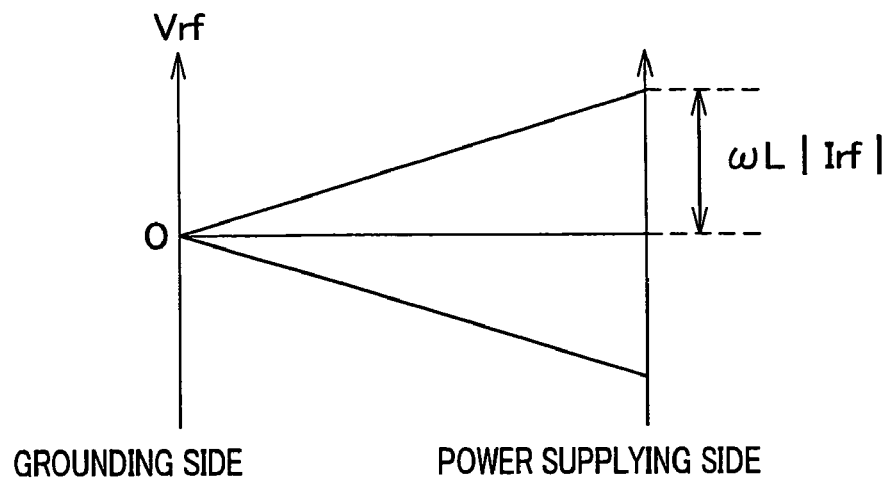
FIG. 8(a) and FIG. 8(b) are graphs each showing an amplitude-to-ground in case where high frequency currents are supplied to antenna conductors serving as inductive loads.
Figure 8B:
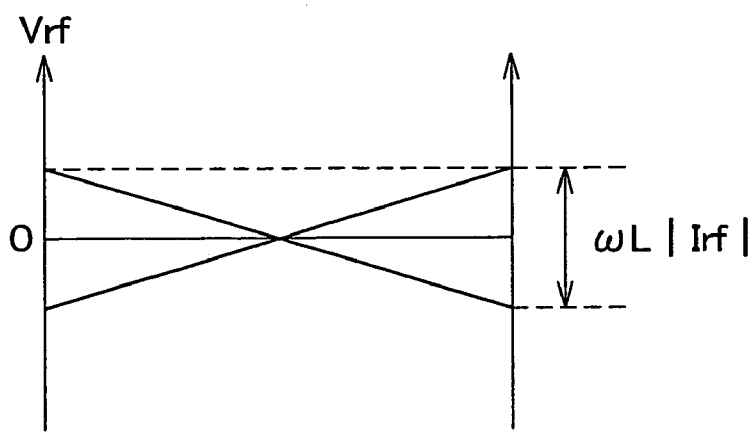

Further, as apparent from a voltage oscillation in the antenna conductor 1a of FIG. 8(a) and FIG. 8(b), an end portion of the antenna conductor 1a has an amplitude-to-ground which causes a high frequency voltage to be high in case where the antenna conductor 1a is grounded and in case where the antenna conductor 1a has a floating potential.

Figure 11:
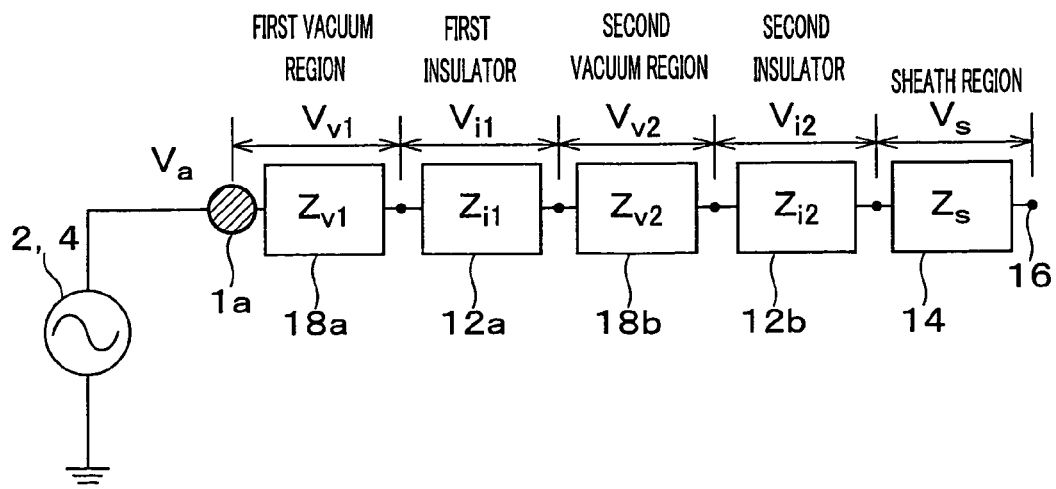
FIG. 11 is a block diagram showing a voltage of each portion provided in a plasma generation device of Embodiment 3 according to the present invention.

Thus, in a plasma generation device of Embodiment 3 according to the present invention, as shown in FIG. 11, a first insulator 12a (corresponding to the insulator 12) is provided around a portion of the antenna conductor 1a which portion exists in the vacuum chamber 6 (more preferably, all the portions of the antenna conductor 1a) so that a first vacuum region 18a (corresponding to the vacuum region 18) intervenes therebetween, and a second insulator 12b is provided around the first insulator 12a so that a second vacuum region 18b intervenes therebetween, so as to cover the first insulator 12a.

Thus, it is possible to effectively and further decrease a high frequency voltage applied to the sheath region 14 in the vicinity of an end portion of the antenna conductor 1a which high frequency voltage causes (i) sputtering of the second insulator 12b and (ii) an anomalous fluctuation of a plasma potential. Examples of a preferable shape of the second insulator 12b are a shroud tube or a shroud plate.

An equivalent circuit in case of disposing the second insulator 12b around the first insulator 12a so that the second vacuum region 18b intervenes therebetween is shown in FIG. 11, and a voltage (Vs) applied to the plasma sheath region 14 is represented by the following equation (3) using (i) a voltage (Va) generated in the antenna conductor 1a, (ii) a potential drop (Vv1) in the first vacuum region 18a, (iii) a potential drop (Vi1) in the first insulator 12a, (iv) a potential drop (Vv2) in the second vacuum region 18b, and (v) a potential drop (Vi2) in the second insulator 12b.

$$Vs = Va - Vv1 - Vi1 - Vv2 - Vi2 = Va \cdot Zs / (Zv1 + Zi1 + Zv2 + Zi2 + Zs) \quad (3)$$

In Embodiment 3 arranged in this manner, it is possible to effectively and further decrease a high frequency voltage applied to the sheath region 14 in an end portion of the antenna conductor 1a.

In the equation (3), Zv1 represents an impedance of the first vacuum region 18a, and Zi1 represents an impedance of the first insulator 12a, and Zv2 represents an impedance of the second vacuum region 18b, and Zi2 represents an impedance of the second insulator 12b.

EMBODIMENT 4

Figure 14:
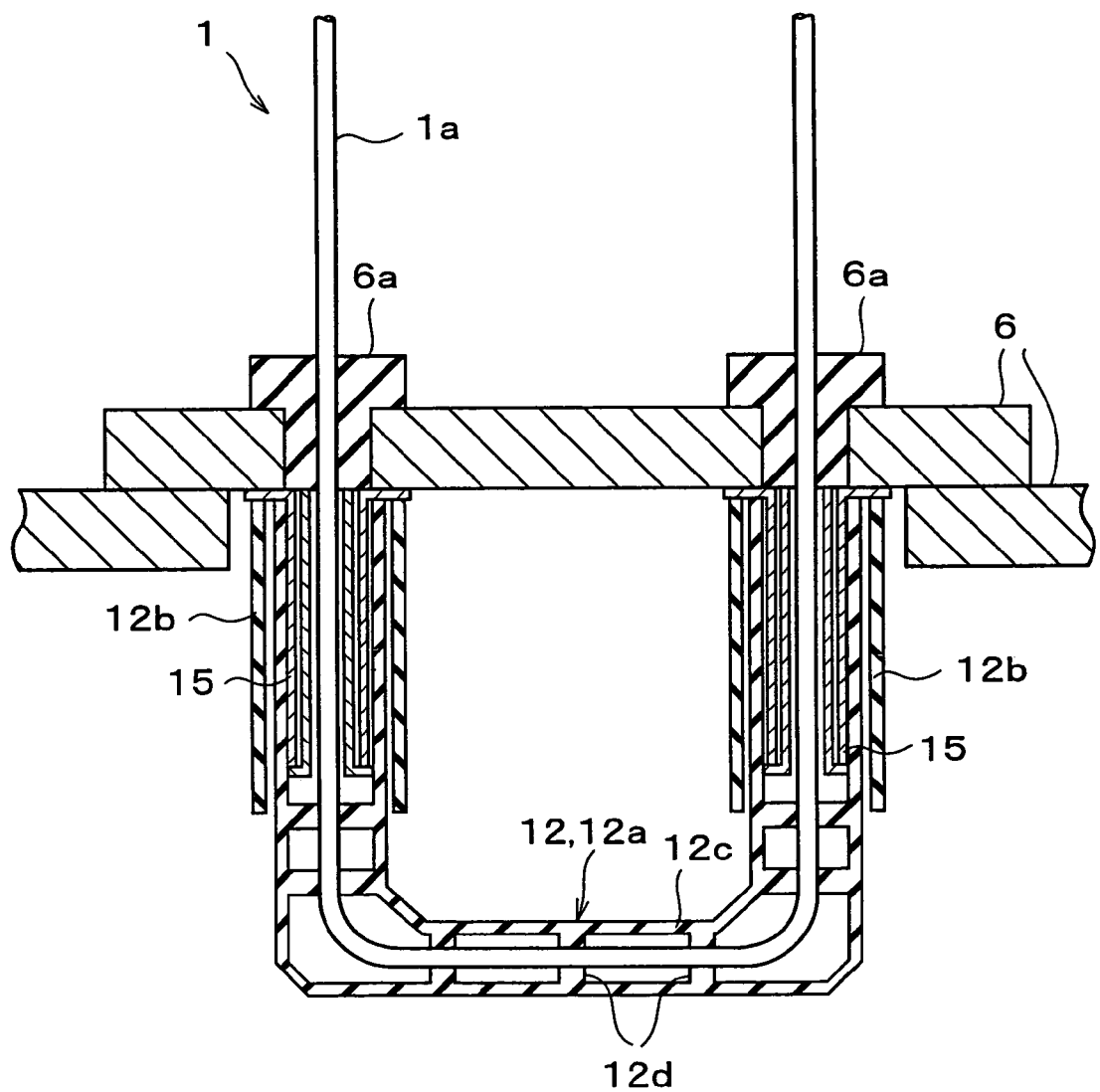
FIG. 14 is a cross sectional view of a peripheral structure of an antenna in a plasma generation device of Embodiment 4 according to the present invention.
Figure 15:
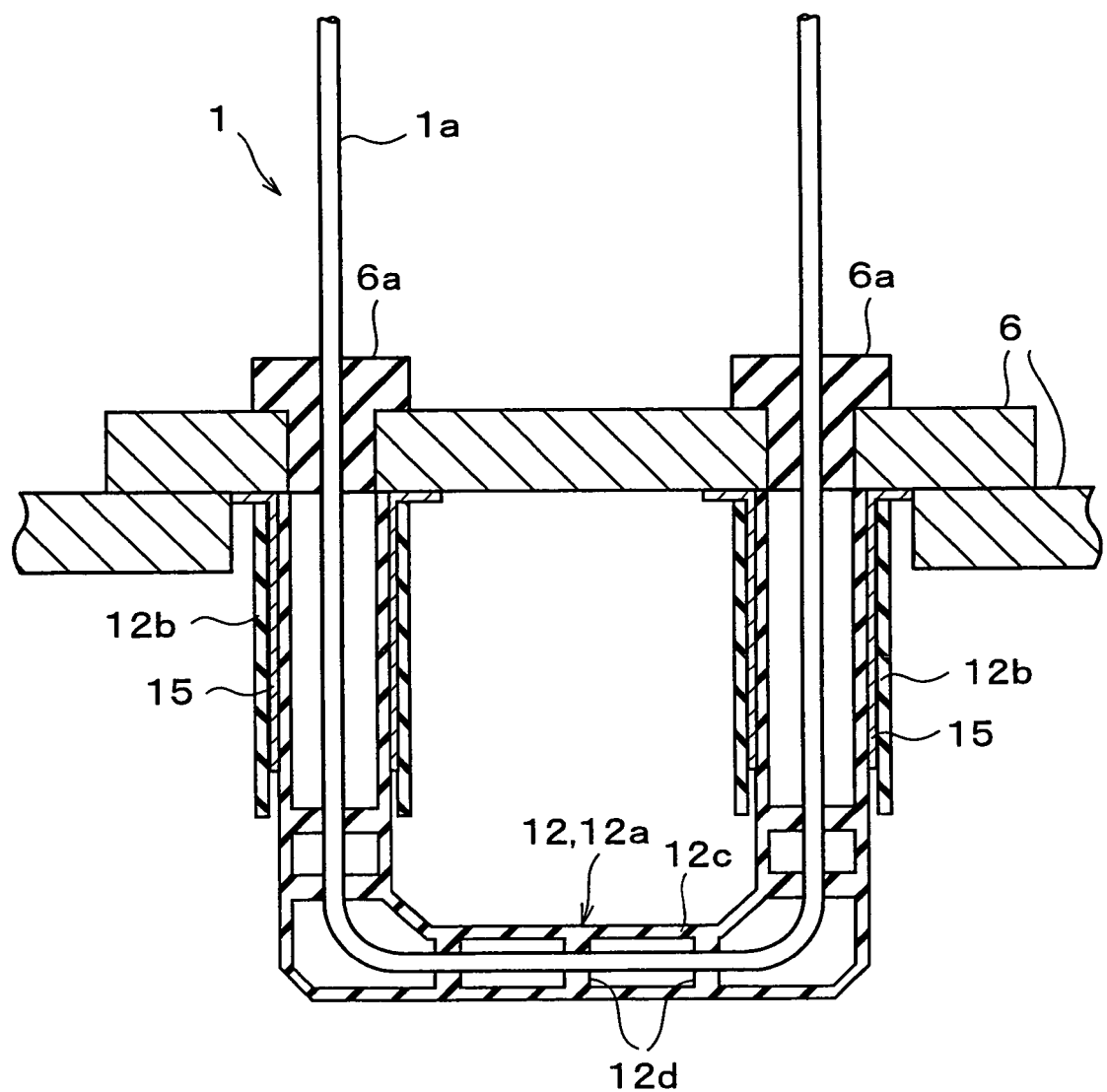
FIG. 15 is a cross sectional view of a modification example of the peripheral structure of the antenna in the plasma generation device of Embodiment 4.
Figure 16A:
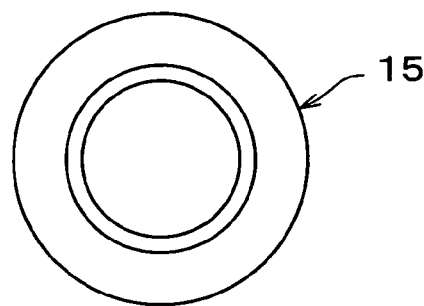
FIG. 16(a) to FIG. 16(c) show conditions of a grounding electrode of Embodiment 4.
Figure 16B:
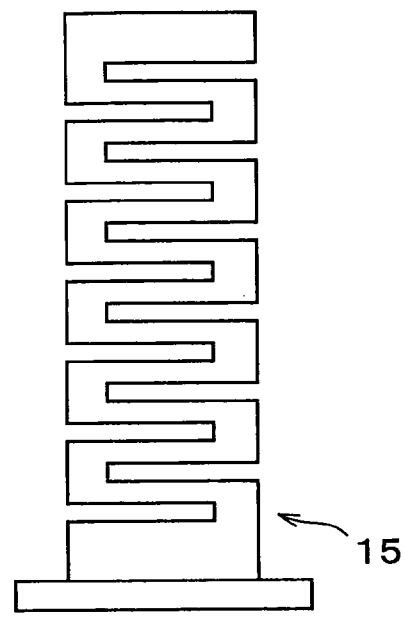
Figure 16C:
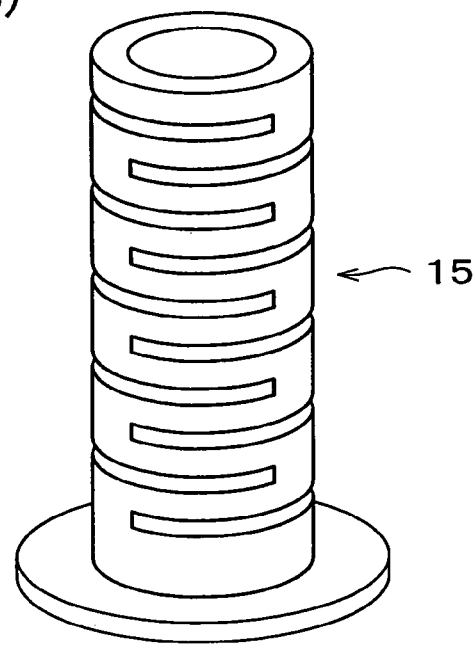

Further, in a plasma generation device of Embodiment 4 according to the present invention, as shown in FIG. 14 to FIG. 16, a cylindrical grounding electrode 15 whose cross sectional surface has a zigzag structure is provided on an end portion of the antenna conductor 1a so as to be positioned in proximity to a wall of the vacuum chamber 6 with the grounding electrode 15 surrounding the first insulator 12a as a coaxial structure.

The zigzag structure in the cross sectional surface is such that: the grounding electrode alternately protrudes in a direction orthogonal to a conduction direction (long axis direction) of the antenna conductor 1a so that a long axis direction of the grounding electrode corresponds to the conduction direction of the antenna conductor 1a.

By providing the grounding electrode 15, it is possible to prevent the high frequency voltage generated in an end portion of the antenna conductor 1a from being applied to the plasma sheath region 14.

Further, when the second insulator 12b is disposed around the grounding electrode 15, the grounding electrode 15 and the second insulator 12b prevent the high frequency voltage generated in the end portion of the antenna conductor 1a from being applied to the plasma sheath region 14 more effectively, thereby completely shielding the electrostatic coupling of the antenna conductor 1a to the plasma.

Here, the grounding electrode 15 is arranged so as to have a zigzag structure, so that it is possible to effectively shield capacitive (electrostatic) coupling caused by a high frequency voltage generated in an antenna introduction section, and it is possible to enlarge a current path to an inductive electric field induced in the grounding electrode 15, and it is possible to suppress heat generation induced at the grounding electrode 15, and it is possible to reduce power loss.

Figure 12:
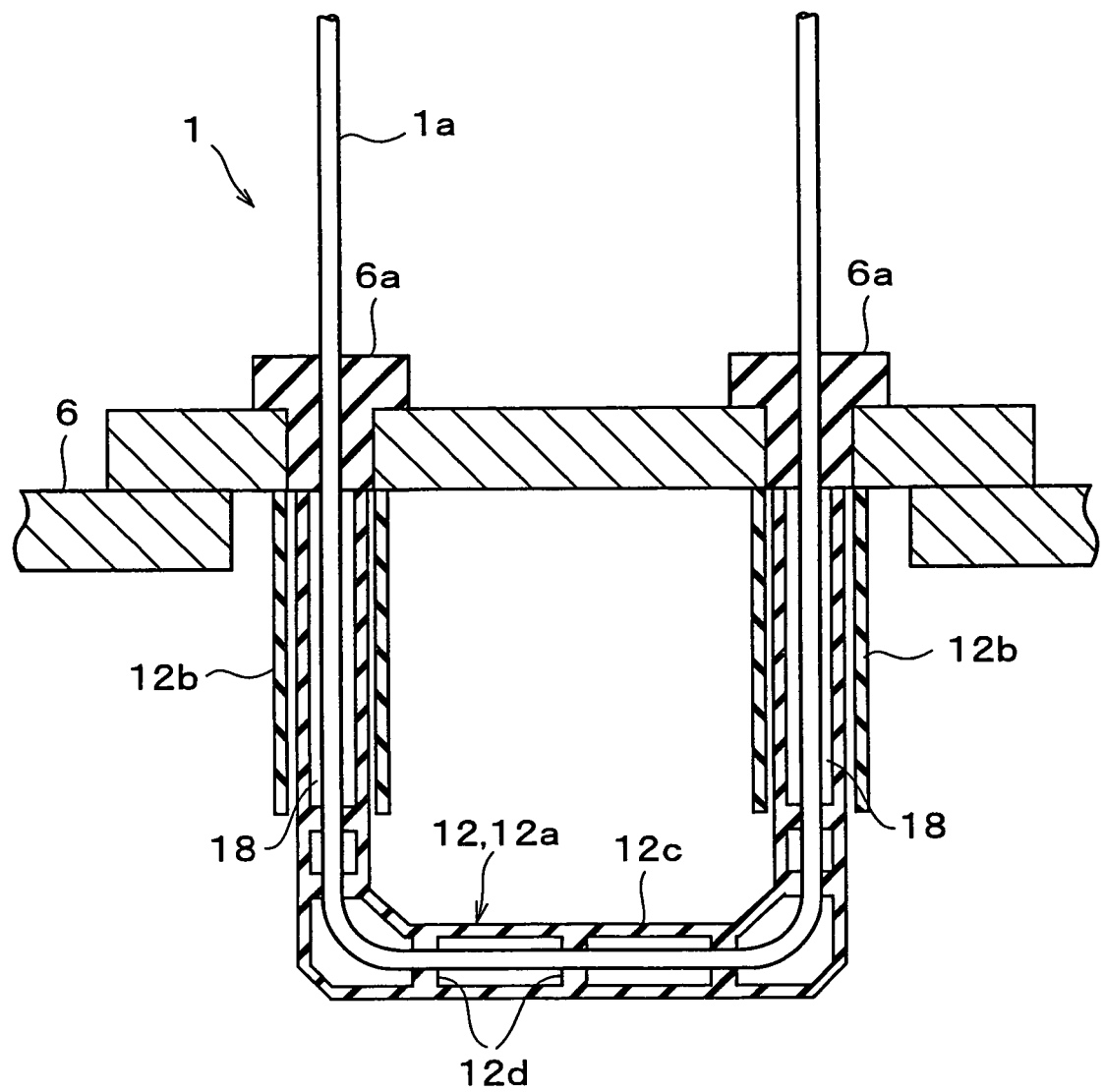
FIG. 12 is a cross sectional view of a peripheral structure of an antenna in each of the plasma generation devices of Embodiments 2 and 3.
Figure 13:
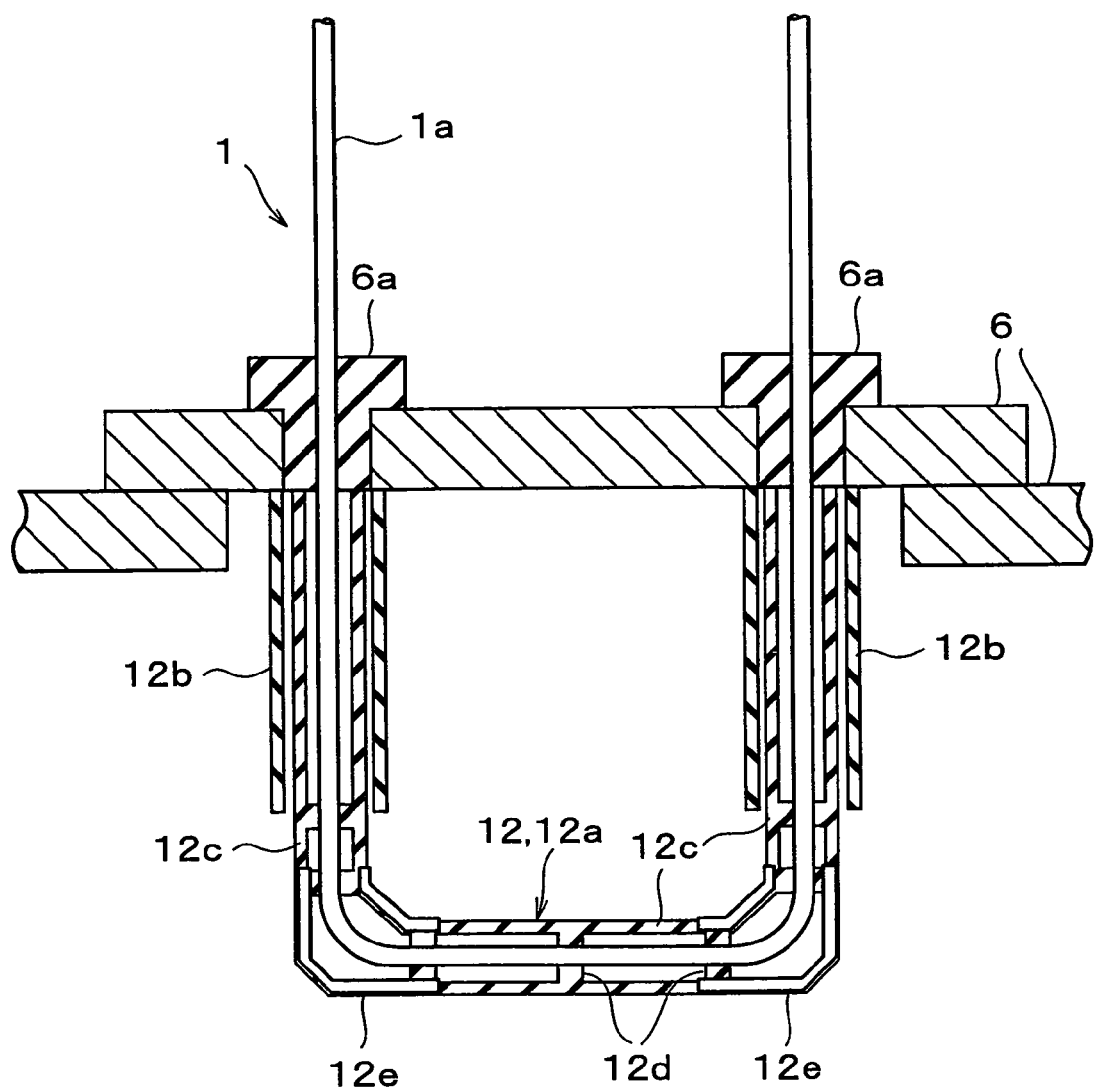
FIG. 13 is a cross sectional view of a modification example of the peripheral structure of the antenna in each of the plasma generation devices of Embodiments 2 and 3.

The following description explains examples of the antenna 1 in Embodiments 2 and 3 with reference to FIG. 12 and FIG. 13. First, as shown in FIG. 12, the antenna 1 is arranged so that: the antenna conductor 1a which generates an inductive electric field on the basis of the applied high frequency power is installed in a high frequency field through 6a serving as a vacuum flange in the vacuum chamber 6 or in a chamber wall, and the antenna conductor 1a is made of a metallic pipe or a metallic plate, and the cylindrical insulator 12 is provided around a portion of the antenna conductor 1a, more preferably all the portions of the antenna conductor 1a, which portion exists in the vacuum chamber 6 so that the vacuum region 18 intervenes therebetween, so as to completely shield the antenna conductor 1a from the plasma.

In the present example, the insulator 12 has a cylindrical main portion 12c and a holding insulator 12d. The main portion 12c is provided above the antenna conductor 1a so that the vacuum region 18 intervenes therebetween, so that the holding insulator 12d is inserted into the main portion 12c in a rib manner extending from an internal wall of the main portion 12c toward the inside so as to hold the antenna conductor 1a. On this account, the insulator 12 is stably disposed around the antenna conductor 1a so that the vacuum region 18 intervenes therebetween.

Further, an area of a loop surrounded by (i) a portion of the antenna conductor 1a which portion exists in the vacuum chamber 6 and (ii) a wall of the vacuum chamber 6 is preferably ½ or less of a cross sectional area (projective area) of the vacuum chamber 6 in a planar surface in which the antenna conductor 1a exists so as to reduce the inductance of the antenna conductor 1a.

L indicative of the inductance becomes higher substantially in proportion to $S \times N^2$ under such condition that an area of a loop surrounded by inductive antennas is S and a turn number is N. Thus, in order to further reduce the inductance of the antenna conductor 1a whose inductance has been reduced by setting the turn number to be 1 or less, it is effective to reduce the area of the loop surrounded by the portion of the antenna conductor 1a and the wall of the vacuum chamber 6.

It is so arranged that the inductance of the antenna conductor 1a in a antenna system is low in this manner, so that it is possible to suppress a high frequency voltage generated in the antenna conductor 1a. Further, it is so arranged that the insulator 12 disposed around all the portions of the antenna conductor 1a which portions exist in the vacuum chamber 6 has no seam so as to completely shield the antenna conductor 1a from the plasma.

Further, the second insulator 12b may be disposed around the insulator 12 so that the vacuum region 18 intervenes therebetween. Examples of a shape of the second insulator 12b are a shroud tube and a shroud plate. In this case, the insulator 12 serves as the first insulator 12a. On this account, electrostatic coupling of the high frequency voltage generated in the end portion of the antenna conductor 1a and a plasma is suppressed, so that it is possible to reduce generation of impurities which is caused by sputtering of the insulator 12 and it is possible to suppress fluctuation of a plasma potential.

Further, the second insulator 12b is provided, so that it is possible to prevent a film forming material from completely coating the first insulator 12a disposed around the antenna conductor 1a and it is possible to prevent the high frequency inductive electric field from being shielded.

Further, an arrangement of an example shown in FIG. 13 is different from arrangements of Embodiments 2 and 3 according to the present invention. In Embodiments 2 and 3, it may be so arranged that there is provided a connection section 12e for forming a curved portion of the insulator 12, disposed around the antenna conductor 1a. The main portions 12c which are formed in linear shapes are connected to each other via the connection section 12e.

The connection section 12e may be made of any material such as ceramic, glass, metal, or the like, as long as the material has a heat resistance property and can be processed into a curved shape. Combination of the connection section 12e and each main portion 12c serving as an insulator having a pipe shape and a linear shape easily realizes the first insulator 12a.

Next, the following description explains an example of Embodiment 4. As shown in FIG. 14 and FIG. 15, there is provided a tubular grounding electrode 15 which effectively shields a high voltage generated in the high frequency introduction section of the antenna conductor 1a so as to suppress the capacitive coupling of the antenna voltage to the plasma. The grounding electrode 15 is provided so as to cover the antenna conductor 1a from the outside and so as to be coaxially positioned with respect to the antenna conductor 1a. In FIG. 14, the grounding electrode 15 is provided between the antenna conductor 1a and the first insulator 12a. In FIG. 15, the grounding electrode 15 is provided between the first insulator 12a and the second insulator 12b. The metallic grounding electrode 15 used in this case has a cross sectional surface arranged in a zigzag manner as shown in FIG. 16.

On this account, it is possible to effectively shield the capacitive coupling caused by the high frequency voltage generated in the introduction section of the antenna conductor 1a, and it is possible to enlarge a current path to the inductive electric field induced in the grounding electrode 15 due to the zigzag structure, so that it is possible to suppress heat generation induced at the grounding electrode 15 and it is possible to reduce power loss.

Figure 17:
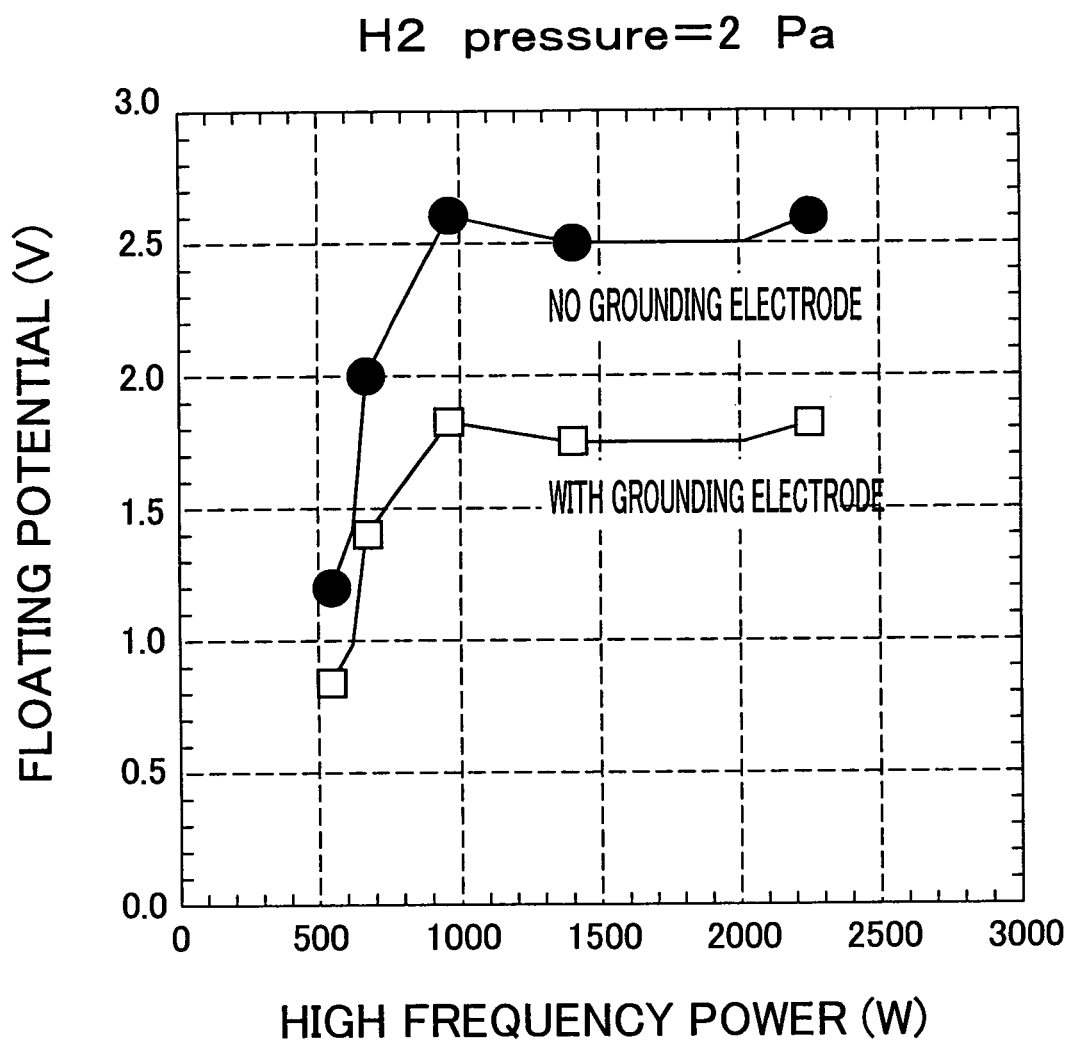
FIG. 17 is a graph showing how a floating potential of a plasma changes depending on whether the grounding electrode is provided or not in Embodiment 4.

Further, FIG. 17 shows results each of which was obtained by measuring, with a Langmuir probe, a floating potential in a hydrogen plasma generated by using each of antennas 1 of examples shown in FIG. 12 (no grounding electrode) and FIG. 15 (with a grounding electrode). FIG. 17 shows that: in case where the grounding electrode is provided, it is possible to more effectively reduce the plasma potential than the case where no grounding electrode is provided.

These results show that: by providing a shield for preventing a high frequency voltage generated in an end portion of the antenna conductor 1a from being applied to the plasma sheath region 14, that is, by providing the grounding electrode 15 for example, it is possible to reduce the plasma floating potential, thereby generating a stable and favorable plasma.

EMBODIMENT 5

In the present invention, it is preferable that a sensor (not shown) for measuring an intensity of a high frequency inductive magnetic field irradiated from the antenna conductor 1a is provided in the vacuum chamber 6. As the sensor, it is possible to use a sensor 30 described in Embodiment 6.

A physical quantity measured by the sensor is an intensity of the high frequency magnetic field irradiated from the antenna conductor 1a, preferably, an azimuthal direction with respect to an antenna current. In the measurement, it is possible to use a high frequency current probe (pickup coil, loop coil, and the like) disposed in an insulation shroud tube.

A position in which the sensor is installed is a position in proximity to an installation potential of the antenna 1, preferably, a position within 50 mm from a dielectric material (insulator) shield of the antenna 1 (a position in which the high frequency magnetic field attenuates from the surface of the shield to $1/10$).

Physical interpretation and effect in the quantity of measurement are as follows. A high frequency magnetic field irradiated from the antenna 1 is induced by a high frequency current flowing in the antenna 1, and the high frequency magnetic field has a component mainly in an azimuthal direction with respect to an antenna current. Thus, by measuring the intensity of the high frequency magnetic field and comparing the intensity with the high frequency current flowing in the antenna 1 (calculating an intensity ratio, a phase difference), it is possible to obtain the following information.

1) It is possible to directly measure the intensity of the high frequency magnetic field which drives inductively-coupled discharge in the plasma. An effect thereof is as follows. The measurement corresponds to a condition under which a driving source in generating the plasma is directly monitored, so that feedback control performed so as to make the quantity of measurement constant in stably generating the plasma allows a plasma generation condition to be kept constant.

In the conventional art, the control is performed merely based on an empirical rule obtained from a tendency in each process, so that it may be difficult to keep the plasma generation condition constant.

Further, the inductively-coupled plasma has the following characteristics: (a) A high frequency current Irf is allowed to flow to the antenna, so that a high frequency magnetic field B in proportion to the current Irf occurs in an azimuthal direction of the current; (b) On the basis of Faraday's law of induction, the high frequency magnetic field B, which alternates at a frequency of the high frequency power source, causes an inductive electric field E having an intensity in proportion to the high frequency current Irf and an alternating frequency [Faraday's law of induction: rot $E=-\delta B/\delta t$]:$E \propto B$ ($\propto Irf$)×frequency; (c) The inductive electric field E accelerates electrons in the plasma to be accelerated, thereby driving the inductively-coupled discharge.

In the present invention, a sensor for directly measuring the intensity of the high frequency inductive magnetic field irradiated from the antenna conductor 1a is provided in the vacuum chamber 6, so that it is possible to directly measure the high frequency magnetic field which drives the inductively-coupled plasma, thereby measuring not the plasma density and the electron temperature each of which results from the plasma generation but the plasma generation condition (driving source) per se.

2) By comparing the intensity of the high frequency magnetic field with the high frequency current flowing in the antenna 1 (calculating an intensity ratio, a phase difference), it is possible to estimate a quantity of substances adhering to a surface of the dielectric material shield disposed around the antenna 1.

A specific effect of the estimation is as follows. As a ratio at which the adhering substances absorb and shield the high frequency magnetic field increases, a ratio of the high frequency magnetic field intensity with respect to Irf decreases. Thus, by monitoring the ratio of the high frequency magnetic field intensity with respect to Irf, it is possible to surely find a time in which a vicinity of the antenna should be cleaned with appropriate etching gas or the antenna should be replaced with a new antenna.

Meanwhile, in the conventional art, it is necessary to perform cleaning or replacement based on a trial-and-error empirical rule, so that the cleaning or the replacement is not timely performed. As a result, a process such as film formation using a plasma may be destabilized.

EMBODIMENT 6

Figure 18A:
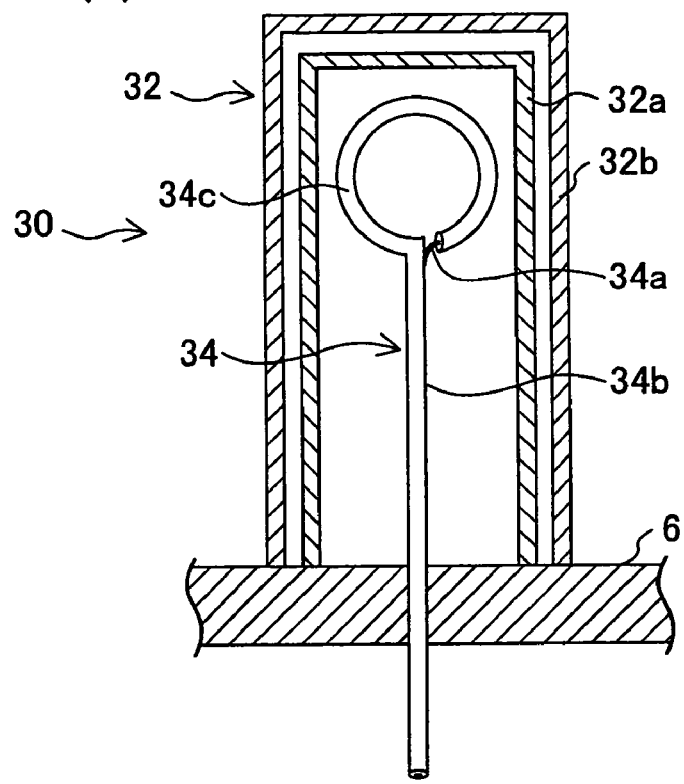
FIG. 18(a) and FIG. 18(b) are schematics each showing a sensor of a plasma generation device of Embodiment 6 according to the present invention.
Figure 18B:
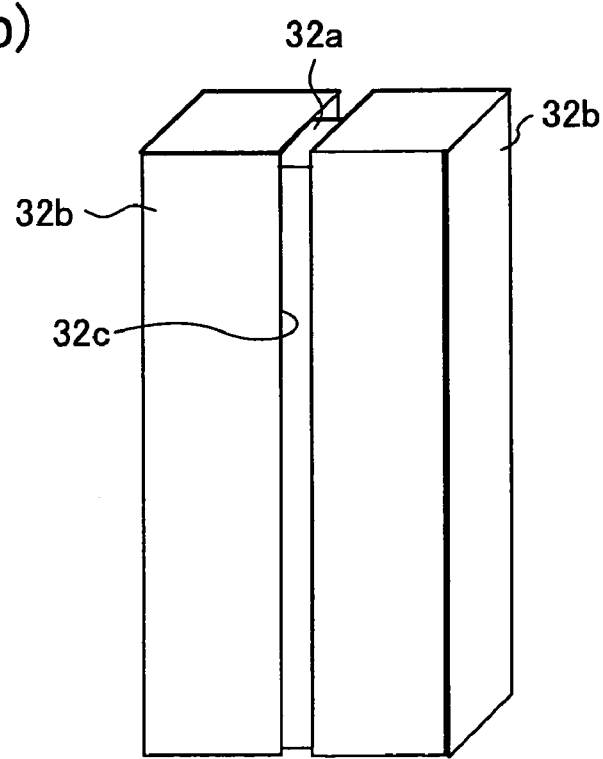

A plasma generation device of Embodiment 6 according to the present invention is arranged so that: as shown in FIG. 18, sensors (magnetic field intensity detection sections) 30 each of which measures a high frequency magnetic field are installed in two or more positions (not shown) which are different from each other in terms of a distance from the antenna 1, so as to measure a high frequency magnetic field intensity at each position. The plasma generation device measures an antenna current in the previously described manner.

As the sensor 30, it is possible to use a sensor having an insulation shroud tube 32 and a loop coil 34 provided in the insulation shroud tube 32. It is possible to provide the sensor 30 on the measuring probe 45 of FIG. 4 which measures the plasma condition.

The insulation shroud tube 32 includes: a dielectric material shield (first shield) 32a for covering the loop coil 34 with a gap therebetween; and an adhering substance shield (second shield) 32b for covering an outside of the inductive shield 32a with a gap therebetween.

The dielectric material shield 32a is made of insulator such as quartz and/or alumina, and may be disposed around a portion of the sensor 30 which portion exists in the vacuum chamber 6 so as to prevent the sensor 30 from being in direct contact with the plasma. The dielectric material shield 32a functions also as a capacitive shield described later.

The adhering substance shield 32b is disposed around the dielectric material shield 32a so as to prevent the adhering substances caused by the plasma from adhering to the entire surface of the dielectric material shield 32a and so as to prevent the loop coil 34 from being shielded against the high frequency inductive magnetic field.

The loop coil 34 has a coil conductor 34a and a capacitive shield 34b covering the coil conductor 34a. The capacitive shield 34b prevents capacitive potential variation of a plasma from having any influence on the sensor 30. Note that, the sensor 30 will be further detailed later.

Figure 19:
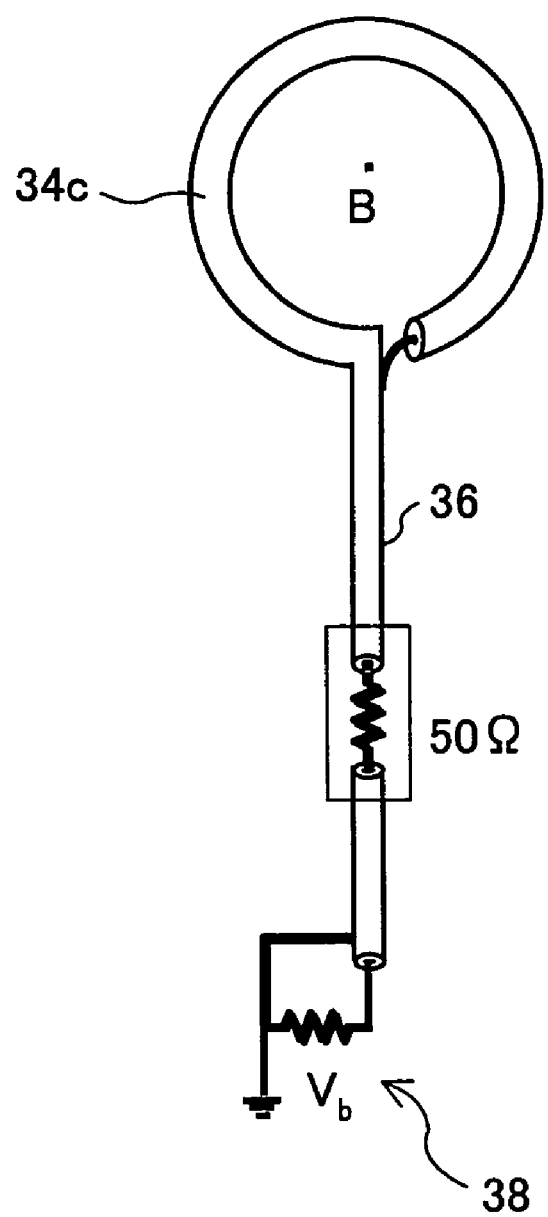
FIG. 19 is a schematic showing the sensor and a detection section.

The loop coil 34 is connected to the detection section 38, positioned outside, via a semi-rigid cable 36 (coaxial cable, characteristic impedance=50Ω) as shown in FIG. 19. The detection section 38 detects a high frequency voltage generated in the loop section 34c of the loop coil 34 so as to measure a high frequency magnetic field intensity (B) in the loop section 34c. The detection section 38 may be the aforementioned measuring circuit 46.

The measurement of the high frequency magnetic field intensity (B) is performed in plural points in the vicinity of the antenna 1 in the vacuum chamber 6, thereby obtaining the following effects [1] to [3].

[1] An attenuation property of the intensity of the high frequency inductive magnetic field, irradiated from the antenna conductor 1a, in the plasma is measured, thereby estimating the plasma density in the vicinity of the antenna (in the vicinity of a point in which the sensor 30 serving as the magnetic probe is installed).

[2] It is possible to estimate the high frequency inductive magnetic field in the vicinity of a surface of the insulator 12.

[3] It is possible to estimate the quantity of substances adhering to the surface of the insulator 12.

A relation between (i) an electromagnetic wave (frequency $f_0$) irradiated from a high frequency antenna or the like to a plasma and (ii) a shielding frequency fpe determined by the electron density (ne) of the plasma is such that: under a condition of such high density that $f_0$<fpe, due to a skin effect, an intensity of the electromagnetic wave exponentially attenuates with respect to a distance r from a boundary surface being in contact with a plasma to which the high frequency power is supplied, so that the electromagnetic wave enters the plasma merely to the region with a characteristic length as short as the skin depth δP (a length at which the intensity attenuates to 1/e in the plasma: e represents exponential of a natural logarithm).

Figure 20:
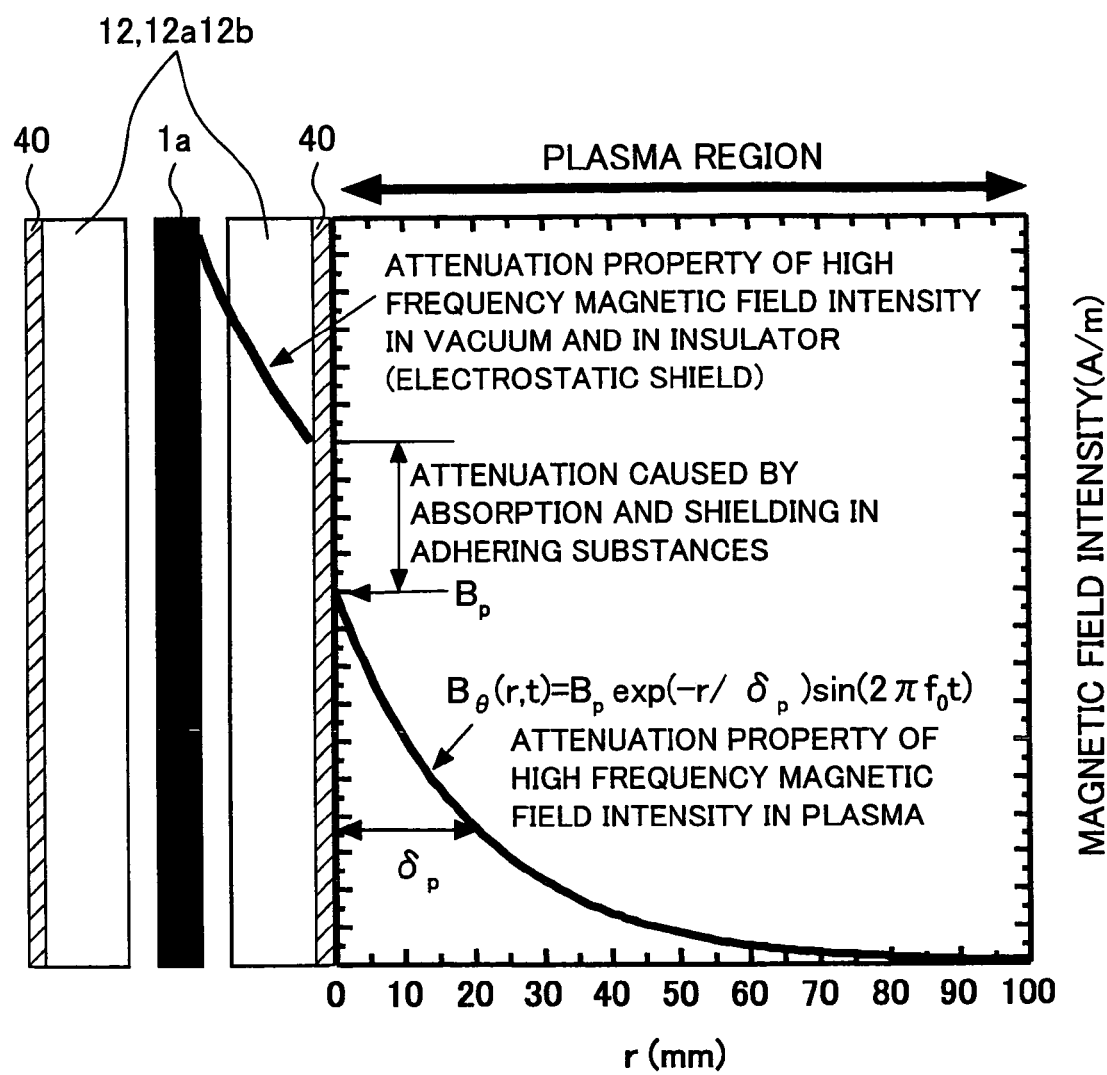
FIG. 20 is a graph showing how a high frequency inductive magnetic field from the antenna conductor is attenuated.
Figure 21:
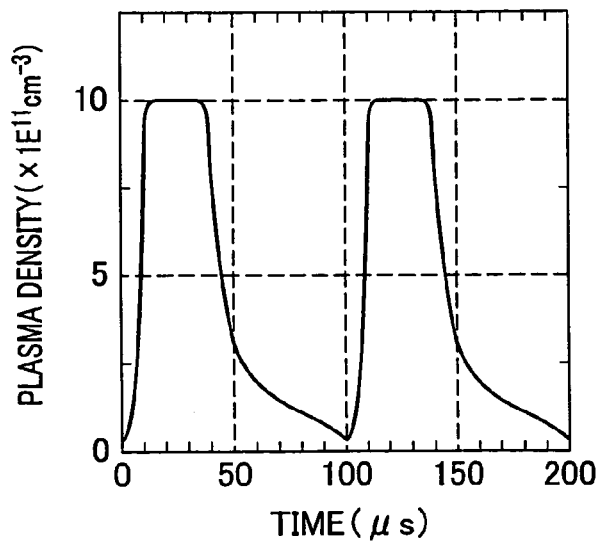
FIG. 21(a) to FIG. 21(c) are graphs each showing a temporal change of a plasma condition which is caused by pulse driving of a conventional inductively-coupled load.
Figure 21:
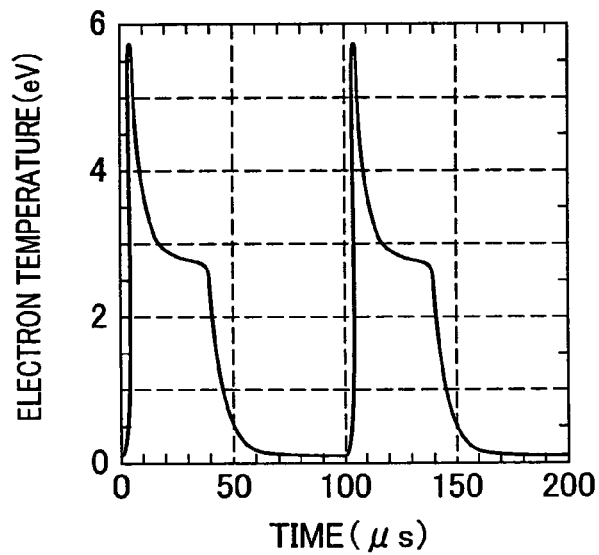
Figure 21:
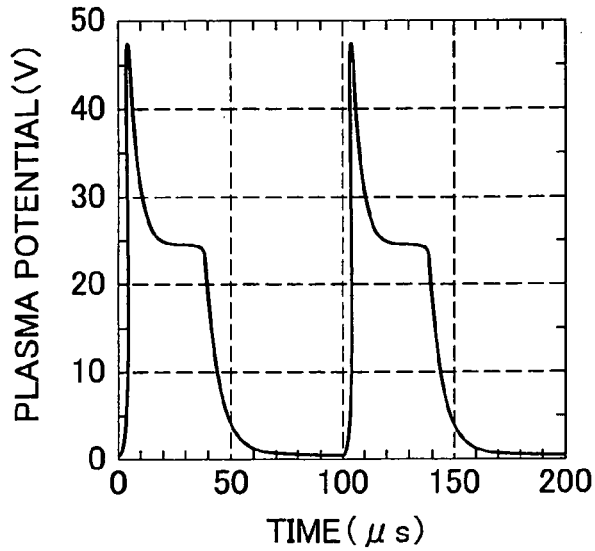

In the arrangement shown in FIG. 20, the high frequency magnetic field generated by allowing the high frequency current to flow to the antenna conductor 1a surrounded by the dielectric material shield (insulator 12) has a component perpendicular to the antenna 1, and an intensity $B_\theta(r,t)$ of the component at the distance r in the plasma is represented by the following equation (4).

$$B_\theta(r,t)=B_p \exp(-r/\delta p)\sin(2\pi f_0 t) \quad (4)$$

$B_p$ represents an amplitude of a high frequency magnetic field of the component, positioned in a plasma side surface at a boundary between the insulator and the plasma, which is perpendicular to the antenna 1. Here, the skin depth δp depends on a kind of discharge gas, a pressure, a value of a high frequency, electron energy distribution function of a plasma, and plasma density. However, in generating a plasma, a kind of discharge gas, a pressure, and a value of a high frequency have already been known, so that the skin depth δp depends merely on the plasma generation condition (electron temperature and plasma density). Further, FIG. 20 shows a calculation result concerning an attenuation property of a high frequency magnetic field in an argon plasma in which the plasma density is $10^{11}$ cm$^{-3}$ and the electron temperature is 3 electron volts.

In case where adhering substances 40 are formed on the plasma side surface of the insulator 12 due to process conditions (a kind of discharge gas, a pressure, high frequency power, and the like), the high frequency magnetic field intensity $B_p$ in the plasma side surface of the insulator 12 generally deceases since the high frequency power is absorbed and shielded by the adhering substances 40. When the high frequency magnetic field intensity at a surface positioned inside the adhering substances 40 of the insulator 12 is $B_0$, the high frequency magnetic field intensity Bp is represented by the following equation (5).

$$B_p=(1-\eta d)B_0 \quad (5)$$

Here, ηd represents a ratio at which the high frequency magnetic field intensity inside the adhering substances 40 on the surface of the insulator 12 decreases since the high frequency power is absorbed and shielded by the adhering substances 40. In case where there is no adhering substances 40, ηd=0. In case where the high frequency magnetic field is completely shielded by the adhering substances 40, ηd=1.

Further, the high frequency magnetic field intensity $B_0$ in the surface inside the adhering substances on the insulator 12 is in proportion to the high frequency current Irf flowing in the antenna 1. Thus, when a proportional coefficient is $k_0$ and this condition is represented by $B_0 = k_0$ Irf, the high frequency magnetic field intensity $B_\theta(r,t)$ at the distance r is represented by the following equation (6).

$$B_\theta(r,t) = (1-\eta d)k_0 Irf \exp(-r/\delta p)\sin(2\pi f_0 t) \quad (6)$$

Here, in parameters of the equation (6), a value $f_0$ of the high frequency has been known, and the proportional coefficient $k_0$ is a constant determined depending on a structure and a material of the insulator 12. Thus, the skin depth δp serving as an index of the plasma generation condition and ηd indicative of a ratio at which the high frequency power is absorbed and shielded by the adhering substances 40 are unknown. Therefore, the high frequency magnetic field intensity and the antenna current Irf are measured in at least two points in the plasma which are different from each other in terms of a distance from the surface of the insulator 12, thereby determining these unknown values.

On the basis of the values determined in this manner, it is possible to detect (i) the plasma condition in the vacuum chamber 6 and (ii) the quantity of the adhering substances 40 adhering to the insulator 12 covering the antenna 1. On the basis of the detection results, the high frequency oscillation controller 2 allows the driving of each antenna 1 to be controlled in accordance with at least one of a high frequency power, a frequency, and a phase, thereby controlling the plasma condition in the vacuum chamber 6.

In an example where the high frequency magnetic field intensity $B_\theta(r,t)$ is measured in two positions such as r=r1 and r=r2 (r1>r2) in the plasma which are different from each other in terms of a distance from the surface of the insulator 12, the high frequency magnetic field intensities thereof are respectively $B_\theta(r1,t)$ and $B_\theta(r2,t)$, and thus measured values are used to calculate the skin depth δp which is the unknown value and the ratio ηd at which the high frequency power is absorbed and shielded by the adhering substances 40, as follows, by simultaneously measuring the antenna current Irf.

$$\delta p = (r1-r2)/\ln[|B_\theta(r2,t)|/|B_\theta(r1,t)|] \quad (7)$$

$$\eta d = 1 - |B_\theta(r1,t)|/[k_0 Irf \exp(-r1/\delta p)] \quad (8)$$

In these equations (7) and (8), $|B_\theta(r1,t)|$ represents an amplitude of $B_\theta(r1,t)$, and $|B_\theta(r2,t)|$ represents an amplitude of $B_\theta(r2,t)$, and ln is a natural logarithm.

Practically, as to the ratio ηd at which the high frequency power is absorbed and shielded by the adhering substances 40, it is possible to measure an absolute value thereof by calibrating the proportional coefficient $k_0$ from the equations (7) and (8) in case of a new antenna shield having no adhering substances 40 (ηd=0).

The sensor 30 for measuring the high frequency magnetic field can obtain a more accurate measurement result when two points positioned differently from each other preferably away from the surface of the insulator 12 by 10 mm through 70 mm are further separated from each other. Further, a direction in which the loop section 34c of the sensor 30 faces is set so that the high frequency magnetic field detected by the loop section 34c becomes highest. Ordinarily, the direction is set so that a virtual surface having the loop section 34c includes a minute part of the antenna conductors 1a positioned most proximity to the loop section 34c.

Note that, in the foregoing example, the sensors 30 are disposed in two points in the plasma which are different from each other in terms of a distance from the surface of the insulator 12. However, the number of positions in which the sensors 30 are disposed is not limited to two. It is obvious that the measurement accuracy is improved by disposing the sensors in two or more positions different from each other.

Subsequently, the sensor 30 for measuring the high frequency inductive magnetic field intensity is further detailed as follows. The sensor 30 includes: the capacitive shield 34b for shielding the capacitive potential variation of the plasma; and the dielectric material shield 32a, wherein an adhering substance shield 32b for preventing a region which is in contact with the plasma from being entirely covered with the adhering substances 40 caused by the plasma is provided outside the dielectric material shield 32a.

The high frequency magnetic field intensity is measured as a voltage Vb generated in each of both ends of a coil, obtained by connecting a wire of the coil conductor 34a in a loop manner, by electromagnetic induction based on a time change dB/dt of a magnetic flux through the coil. The time change dB/dt of a magnetic flux through the coil is such that: an electric field Ei is induced along a conducting wire in accordance with Faraday's law of induction ∇×Ei=-dB/dt, and a voltage Vb is generated in each of both ends of the coil as an integral value along the conducting wire of the electric field Ei. Thus, when a value of the frequency is $f_0$, Vb is represented by the following equation (9).

$$Vb \propto 2\pi f_0 |B| \quad (9)$$

Thus, in measuring the high frequency magnetic field, it is preferable that a capacitive shield for shielding capacitive potential variation in the plasma is provided on the sensor 30 so as to improve the measuring accuracy. Further, instead of the loop coil 34, it is possible to use a semiconductor hall element as a magnetic field intensity detector. Also in this case, it is preferable that the capacitive shield is provided so as to suppress noises in the element which are induced by the capacitive potential variation in the plasma, thereby improving the measuring accuracy.

Further, in case where the loop coil 34 is used in a process for forming adhering substances 40 on a surface exposed to a plasma due to a process such as film formation and etching so as to measure the plasma generation condition and the ratio at which the high frequency is absorbed and shielded by the adhering substances 40 on the insulator 12, this raises the following problem: in the loop coil 34, the adhering substances 40 formed also on the surface exposed to the plasma absorb and shield the high frequency magnetic field intensities of the measured points likewise, so that the measuring accuracy becomes low.

Thus, the sensor 30 of the present invention adopts at least one of the following arrangements [1] to [3], thereby solving the foregoing problem.

[1] There is provided the capacitive shield 34b for shielding the capacitive potential variation in the plasma. On this account, it is possible to improve the accuracy in measuring the high frequency magnetic field.

[2] The dielectric material shield 32a made of insulator is disposed around a portion of the coil conductor 34a for detecting the high frequency magnetic field intensity which portion exists in the vacuum chamber 6 so as to prevent the plasma and the coil conductor 34a from being in contact with each other.

[3] The adhering substance shield 32b arranged so as not to shield the antenna 1 from the high frequency inductive magnetic field is disposed around the dielectric material shield 32a so that the entire surface of the dielectric material shield 32a is not covered by the adhering substances caused by the plasma.

The following description explains a specific example of the sensor 30 for detecting the high frequency magnetic field with reference to FIG. 18. FIG. 18(*a*) is a cross sectional view of the sensor 30, and FIG. 18(*b*) is a perspective view of the sensor 30. In this specific example, a semi-rigid cable (coaxial cable) 36 whose characteristic impedance is 50Ω is used. The semi-rigid cable 36 uses an uncoated copper pipe as an external conductor, and a copper wire serving as a central conductor is provided in the copper pipe via an electric insulator made of a fluorine resin or the like.

In this specific example, in order to form the loop coil 34 of the sensor 30, one end portion of the semi-rigid cable 36 is processed into a loop shape (a circular shape, a rectangular shape, or a triangular shape) having a diameter of 10 mm with a single turn, and the coil conductor 34a serving as a central conductor in the end portion of the loop shape is electrically connected to an external conductor of a base end portion in the loop shape. In connecting the coil conductor 34a in the end portion of the loop shape to the external conductor of the base end portion in the loop shape, a gap of approximately 1 mm for example is provided in a connection portion between the external conductor of the base end portion and the external conductor of the end portion so that they are not in electrically contact with each other. In this manner, the loop coil 34 is formed.

A structure of the loop coil 34 is formed by using the semi-rigid cable 36, so that the external conductor effectively functions as the capacitive shield 34b even when the capacitive potential variation occurs in the vicinity of the loop coil 34. Thus, it is possible to shield the capacitive potential variation so as to measure the intensity of the high frequency magnetic field through an internal space surrounded by the coil conductor 34a having the loop shape.

Further, in this specific example, the dielectric material shield 32a made of insulator is disposed around a portion of the loop coil 34 serving as the high frequency magnetic field detector which portion exists in the vacuum chamber 6, so that it is possible to completely prevent the plasma and the loop coil 34 from being in contact with each other. Thus, it is possible to prevent an internal conductor exposed in the gap provided in the connection portion of the loop coil 34 from coming into contact with the plasma, thereby preventing a signal caused-by the plasma potential variation from being mixed therein.

In this specific example, a quartz whose thickness is 1 mm is used as the dielectric material shield 32a made of insulator, but it is possible to use, as a material for the insulator, a material such as alumina, aluminum nitride, and the like, having a low dielectric constant and a high resistivity, each of which is selected from a ceramics dielectric material group superior in the heat resistance property. Further, there is no problem in thickness as long as it is possible to electrically shield the plasma in its entirety. The thickness is preferably about 1 mm.

Further, the adhering substance shield 32b is disposed around the dielectric material shield 32a so that the entire surface of the dielectric material shield 32a is not covered by the adhering substances caused by the plasma and the high frequency magnetic field is not shielded. The adhering substances are prevented from entirely covering the dielectric material shield 32a in order to prevent an eddy current generated in the high frequency magnetic field from shielding the high frequency magnetic field in the adhering substances (conductor) covering the dielectric material shield 32a.

The adhering substance shield 32b is arranged so that: in order to prevent the adhering substances from entirely covering the dielectric material shield 32a and prevent the adhering substance shield 32b from shielding the high frequency inductive magnetic field, as shown in FIG. 18(*b*), the dielectric material shield 32a is not entirely covered, but a gap section 32c having a slit shape is provided.

The gap section 32c is formed so that the high frequency inductive magnetic field reaches the loop coil 34. However, it is preferable that a portion in a longitudinal direction of the gap section 32c is set to be in parallel to a direction of a plane surface surrounded by the loop section 34c of the loop coil 34.

Further, it is possible to more easily form the gap section 32c, so that the gap section 32c is formed so that its longitudinal direction cross the dielectric material shield 32a in a direction perpendicular to a surface of the internal wall provided on the vacuum chamber 6. However, the gap section 32c may be formed so that its longitudinal direction crosses the dielectric material shield 32a in parallel to the surface of the internal wall.

In this specific example, the adhering substance shield 32b is arranged so that two members made of aluminum each of which has a thickness of 0.5 mm constitute the gap section 32c whose width is 1 mm so as to cover the dielectric material shield 32a. Here, as a material used for the adhering substance shield 32b, a material selected from a ceramics dielectric material group can be used instead of the metal. Further, it is more preferable to use a material selected from a ceramics dielectric material group superior in the heat resistance property. Further, a slit width of the gap section 32c for preventing the high frequency magnetic field from being shielded is about 1 mm.

Further, in order to more effectively suppress the formation of the adhering substances on the adhering substance shield 32b, it is preferable to hold the adhering substance shield 32b with it heated. Thus, it may be so arranged that the adhering substance shield 32b includes a heater.

In the specific example shown in FIG. 18, the loop coil 34 was positioned away, at a distance r=60 mm, from the surface of the insulator 12 provided around the antenna conductor 1a for a high frequency, and the dielectric material shield 32a and the adhering substance shield 32b were disposed so as to measure a signal caused by the high frequency magnetic field. At an argon pressure 11 mTorr, high frequency power whose frequency was 13.56 MHz was applied to the antenna 1 so as to generate a plasma. Under such condition that the high frequency power was 506 W, a high frequency magnetic field signal intensity was measured with an oscilloscope having 50Ω terminal end connected to the loop coil 34. As a result of the measurement, a sine wave whose amplitude was 23 mV was observed. This shows that it is possible to measure the high frequency magnetic field in the loop coil 34.

EMBODIMENT 7

First, as to a conventional plasma source (a plurality of loads are connected to a high frequency power source in series or in parallel so as to supply high frequency power, thereby generating a plasma), the following description explains a problem in case of pulsing the discharge (a time to supply the high frequency power and a time to stop supplying the high frequency power are periodically and exclusively set ON-OFF).

In this case, it is impossible to freely change a spatial pattern (spatial distribution) in which the high frequency power is supplied, so that an entire plasma flashes on and off. As shown in FIG. 21(a) to FIG. 21(c), as to a plasma generated in a time to supply the high frequency power (pulse ON time), its plasma density drastically drops due to diffusion to the wall and recombination (FIG. 21(a)) in the time to stop supplying the high frequency power (pulse OFF time), so that its electron temperature (FIG. 21(b)) and its plasma potential (FIG. 21(c)) drop.

The decrease in the electron temperature in the pulse OFF time has been used in generation of negative ions or in a similar process. The decrease in the plasma potential has been used as means for suppressing plasma damage due to decrease in a time-average plasma potential.

However, in this conventional case, there occurs such a problem that: at an initial time in which the pulse OFF shifts to the pulse ON, as shown in FIG. 21(c), a plasma potential at this time becomes much higher than a plasma potential in a steady state, which can cause plasma damage.

It is supposed that this problem results from the following cause. Due to the decrease in the plasma density at the pulse OFF time, electron density at the time of shifting to the pulse ON is lower than that in a steady state. However, the high frequency power which is the same as that in the steady state is supplied, so that the high frequency power density supplied per an electron becomes significantly higher than that in the steady state. Thus, the electrons are more excessively heated than in the steady state, so that the electron temperature rises. As a result, the plasma potential anomalously rises via a sheath on the wall.

Figure 22:
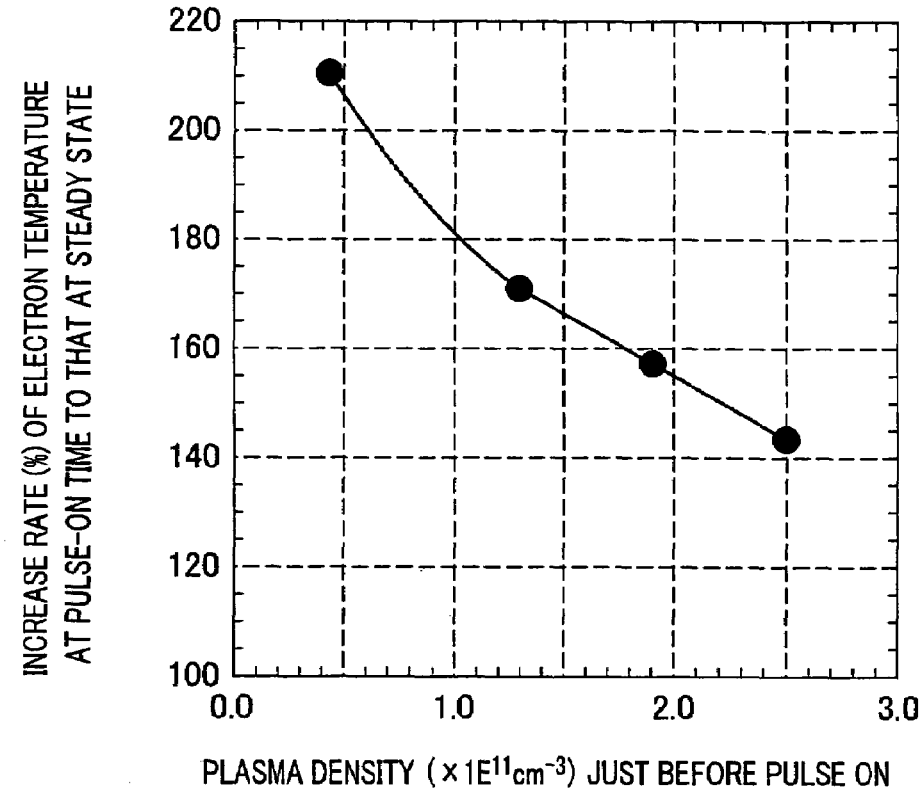
FIG. 22 is a graph showing a condition under which an increase rate of the electron temperature in pulse ON has dependency to plasma density just before pulse ON, with respect to a value of the electron temperature in a steady state in the inductively-coupled load.
Figure 23:
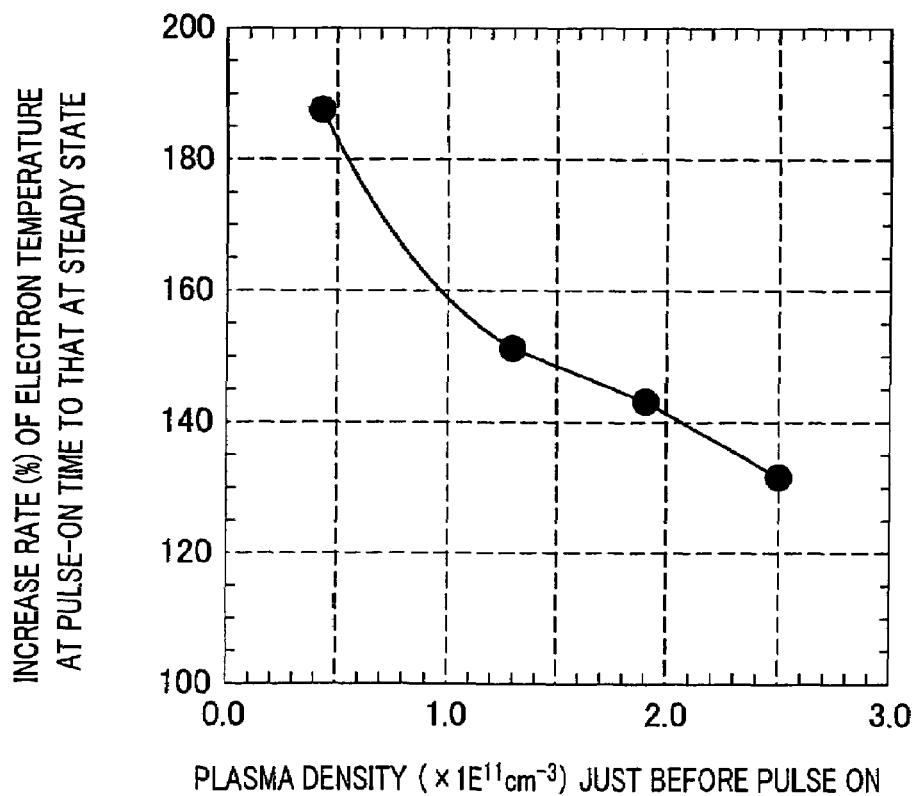
FIG. 23 is a graph showing a condition under which an increase rate of the plasma potential in pulse ON has dependency to plasma density just before pulse ON, with respect to a value of the plasma potential in a steady state in the inductively-coupled load.
Figure 24:
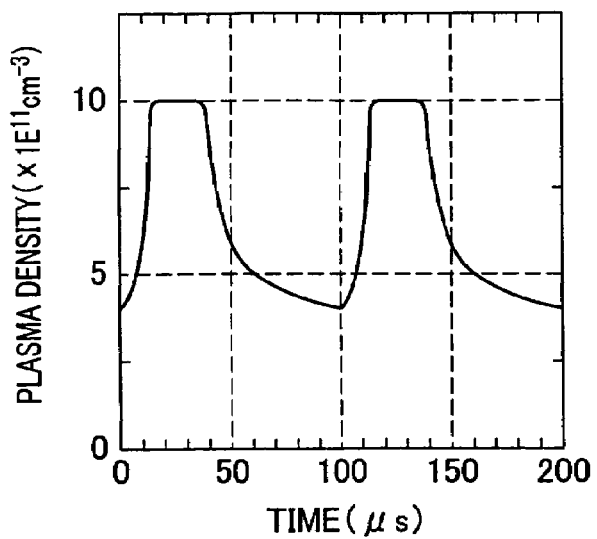
FIG. 24(a) to FIG. 24(c) are graphs each showing a temporal change of a plasma condition which is caused by pulse driving of an inductively-coupled load of Embodiment 6 according to the present invention.
Figure 24:
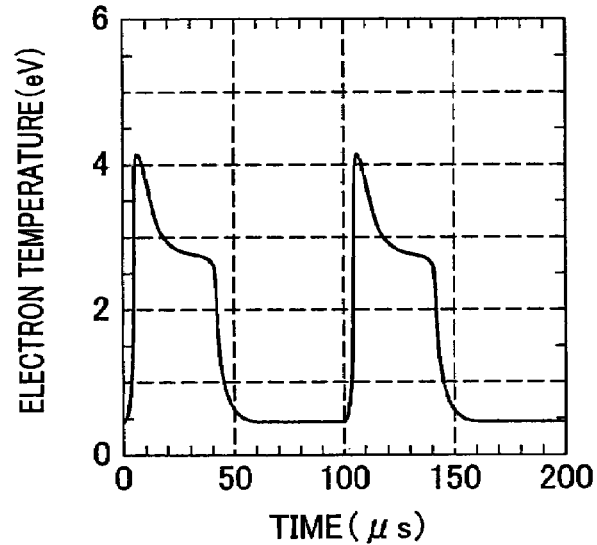
Figure 24:
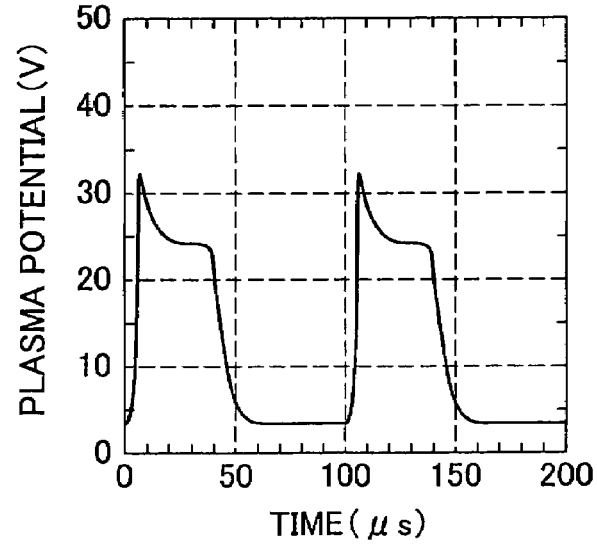
Figure 25:
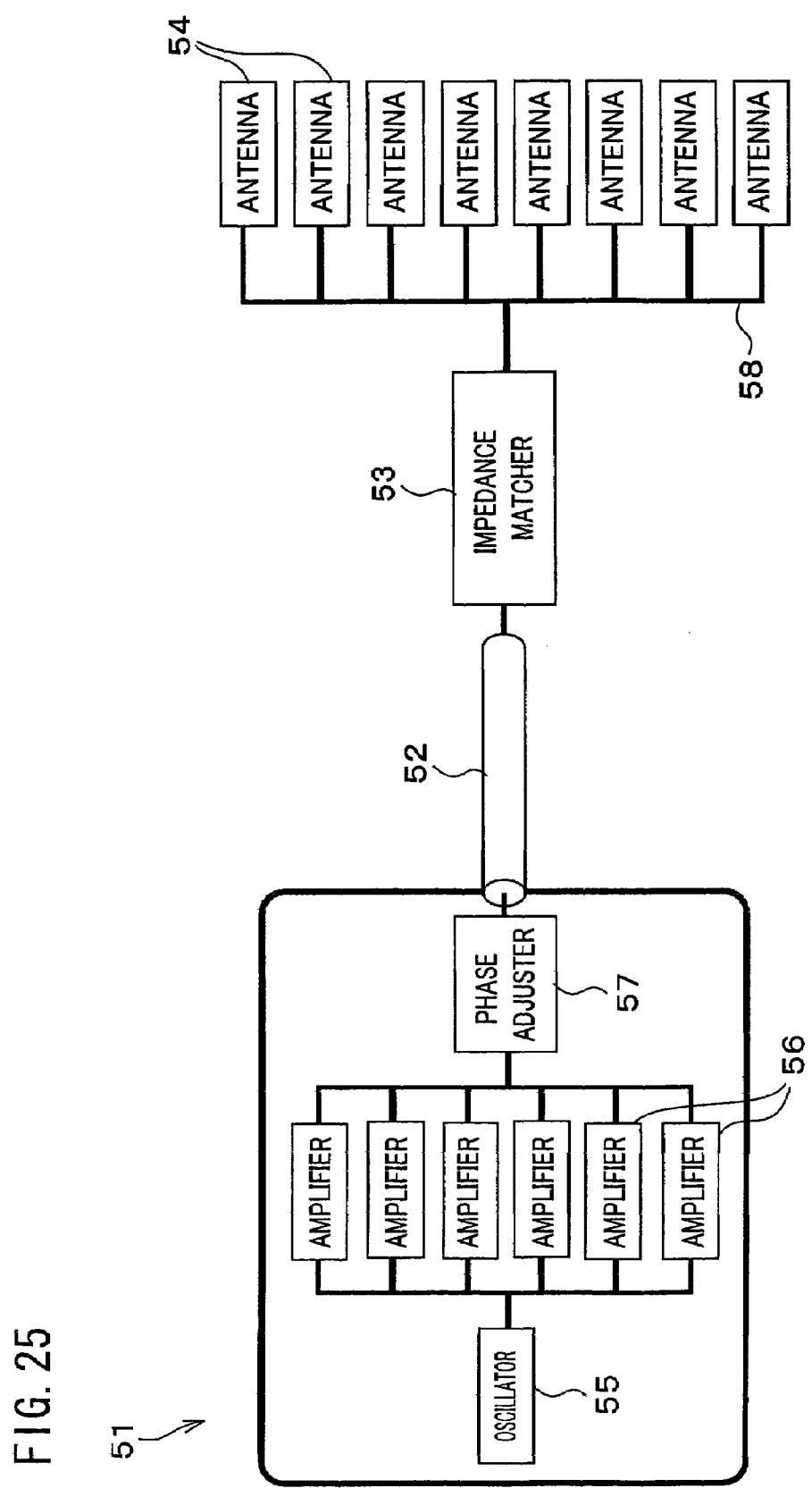
FIG. 25 is a circuit block diagram of a conventional high frequency power supplying device.
Figure 26:
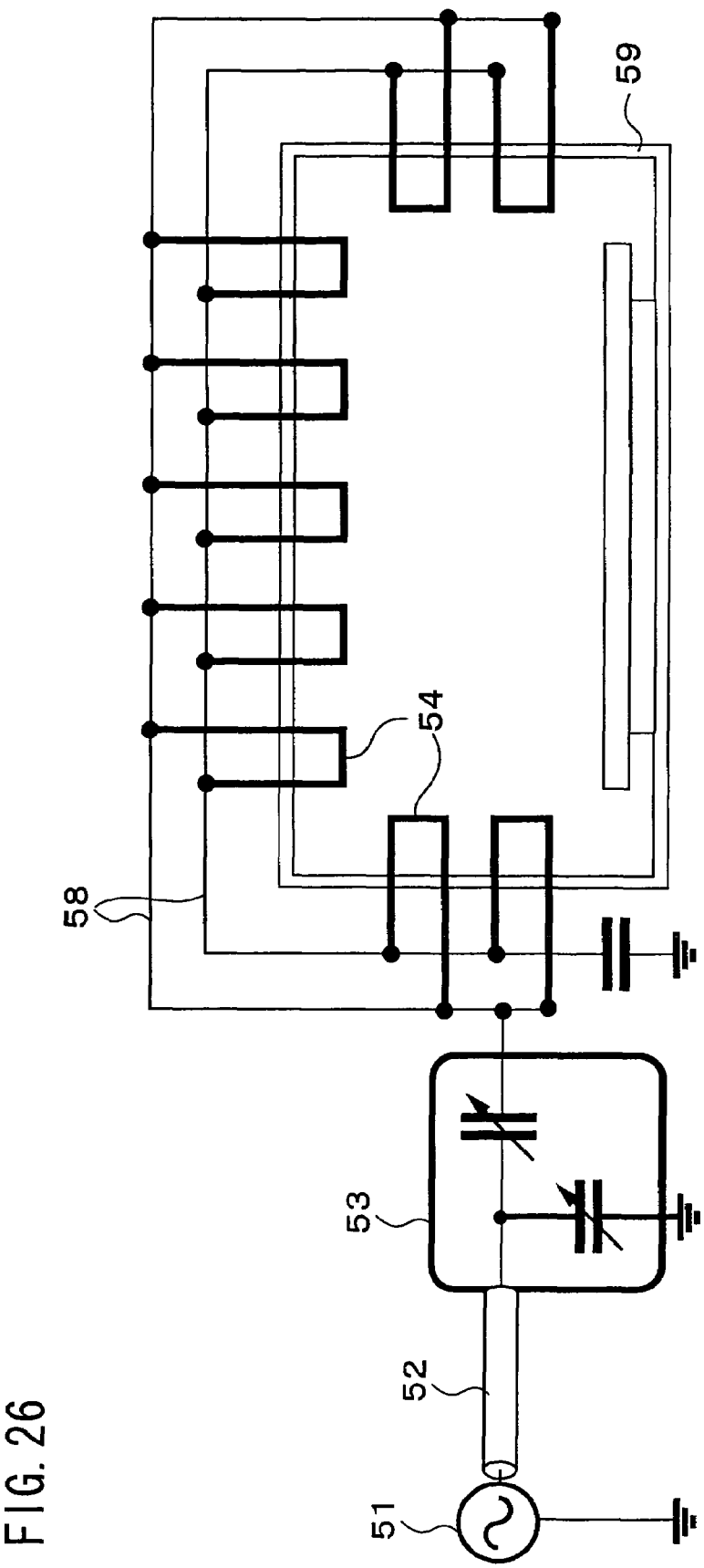
FIG. 26, showing an arrangement of a conventional plasma generation device, is a cross sectional view of the plasma generation device in which a plurality of inductively-coupled antenna conductors are connected to a conventional high frequency power supplying device in parallel.

Incidentally, FIG. 22 and FIG. 23 are graphs each of which shows a condition under which an increase ratio of the electron temperature and the plasma potential have dependency to plasma density just before the pulse ON, with respect to a value of the electron temperature and the plasma potential in the steady state. According to the graphs, as the plasma density just before the pulse ON time is lower, an increase ratio of the electron temperature and the plasma potential is higher due to the heating of electrons in the plasma.

The foregoing problem results from a condition under which ON-OFF operation of the high frequency power supplied to the plasma source is simultaneously performed in the whole plasma source. This is an inevitable problem for a conventional high frequency power supplying plasma generation device.

In order to solve the foregoing problem, the plasma generation device of Embodiment 7 according to the present invention is arranged so that: a pattern (spatial distribution) of high frequency power supplied to each load is independently and periodically changed by a power source corresponding to each load, for pulse discharge (suppression of plasma damage) in which anomalous rise of the plasma potential is suppressed, so as to generate a plasma, thereby controlling the plasma density at a time to shift to the pulse ON condition and suppressing anomalous rise of the electron temperature and the plasma potential.

That is, plural antennas 1 adjacent to each other are divided into groups adjacent to each other, and each of the groups is made to perform pulse operation at an independent timing. Timings for the pulse operation are exclusively deviated from each other so that, even when a load of one group is in a pulse OFF state, an antenna 1 of other group adjacent to that group is in a pulse ON state. By performing the operation, electron density in the vicinity of the antenna 1 belonging to a group which becomes into the pulse ON state is controlled, so that it is possible to suppress anomalous rise of the electron temperature and the plasma potential.

"exclusively" means that both the groups adjacent to each other are prevented from being simultaneously in the ON state. However, the "exclusively" may be such condition that both the groups adjacent to each other are simultaneously in the OFF state.

Next, the following description explains an example where an inductively-coupled load according to Embodiment 7 is used.

Value of the high frequency: 13.56 MHz
High frequency power: 300 W
Pulse period: 10 kHz
Pulse ON time: 40 μs
Pulse OFF time: 60 μs
Discharge gas: Ar
Gas pressure: 20 mTorr In the present example, simulation results (FIG. 24(a) to FIG. 24(c)) concerning a plasma density, an electron temperature, and a plasma potential are as follows. In the present example, a plasma generated by other adjacent inductively-coupled load was diffused. Thus, even just before the load became in the pulse ON state, the density in the vicinity of the inductively-coupled load was kept at 40% with respect to the plasma density in a steady state.

As a result, in the present example, peak values of the electron temperature and the plasma potential just at the timing of the pulse ON were respectively about 4 electron volts and about 30V. In case where the plasma density in the vicinity of an adjacent load was not controlled (FIG. 21(a) to FIG. 21(c)), the plasma potential rose up to about 50V. Compared with this, a remarkable suppression effect was obtained in the present example.

Note that, Embodiments 1 to 7 were respectively described, but it is obvious that any combination thereof may be adopted and effects thereof can be obtained by adopting any combination. Further, in Embodiments 1 to 7, the same reference numerals were given to members of one embodiment which have the same functions as those of other embodiment, and description thereof was omitted.

Incidentally, the conventional plasma process technique is used in (1) a cleaning step in which impurities are removed from a substrate surface for processing, (2) an ashing step in which a resist is removed, (3) a thin film formation step which requires to control a nano structure, and (4) an etching step in which a surface is subjected to a micro fabrication.

The plasma process technique requires (a) higher density (higher throughput) 10 to 100 times as high as that of a conventional plasma source, (b) suppression of damage caused by particles supplied from the plasma to the substrate (less plasma damage), and (c) a larger area (particularly, a larger processed substrate of a meter-size in a field for manufacturing a flat panel display).

These objects are hard to realize merely by scaling up the conventional plasma source and improving the process (the nonuniformity and the plasma damage are increased). That is, when a larger plasma source results in an extremely large plasma generation electrode (¼ wavelength or more) with respect to a wavelength of the high frequency power propagating on the electrode, the wave mature in the high frequency power propagation becomes significant, so that a voltage or current distribution along the electrode becomes extremely nonuniform (formation of standing wave) (see Plasma Sources Sci. Technol. Vol. 9 (2000) p545-561).

In contrast, the plasma generation device and the plasma process of the present invention are arranged so that: a plurality of antennas 1 having low inductances are provided, and the antennas 1 are independently and positively driven and controlled, so as to control the plasma distribution as shown in FIG. 7, thereby realizing less plasma damage and avoiding a problem caused by the standing wave while realizing a larger area, higher density, and a lower potential of the plasma source. As described above, the high frequency power supplying device of the present invention, having two or more loads which are capacitive or inductive, includes high frequency power sources for supplying power to the loads, wherein each of the high frequency power sources is provided in proximity to a corresponding load.

It is preferable to arrange the high frequency power supplying device so that the high frequency power source has a high frequency power amplifier provided in proximity to a corresponding load.

The high frequency power supplying device may be arranged so that a frequency modulation control section for controlling frequencies of high frequency currents supplied to the loads is provided so as to cause the high frequency power sources respectively provided on the loads to independently and simultaneously supply the high frequency currents, identical with each other or different from each other in terms of a frequency, to the two or more loads, and so as to achieve impedance matching of the loads by performing frequency modulation with respect to the high frequency currents supplied to the loads.

The high frequency power supplying device may be arranged so that a phase modulation control section for controlling phases of high frequency currents supplied to the loads is provided so as to cause the high frequency power sources respectively provided on the loads to independently and simultaneously supply the high frequency currents, identical with each other or different from each other in terms of a phase, to the two or more loads.

The high frequency power supplying device may be arranged so that a power control section for controlling high frequency power supplied to the loads is provided so as to cause the high frequency power sources respectively provided on the loads to independently and simultaneously supply one or more kinds of the high frequency power to the two or more loads.

As described above, the plasma generation device of the present invention includes: any one of the aforementioned high frequency power supplying devices; and a vacuum chamber on which the loads are provided, wherein the high frequency power is applied to the loads so as to generate a plasma.

The plasma generation device may be arranged so as to include a measuring section for measuring (i) a high frequency current, (ii) a high frequency voltage, both of which are supplied to each of the loads, (iii) a phase of the high frequency current, and (iv) a plasma generation condition in a vicinity of the load.

The plasma generation device may be arranged so as to include: a negative feedback circuit for generating a control signal from a signal of the high frequency current flowing in the load; and a control system for self-oscillating based on the control signal so as to supply the high frequency power.

It is preferable to arrange the plasma generation device so as to include a plasma control section for independently setting phases and frequencies of high frequency currents supplied to two or more loads adjacent to each other, so as to control an effective acceleration potential of an electron in the plasma, the effective acceleration potential being caused by a high frequency electric field generated in the loads adjacent to each other.

It is preferable to arrange the plasma generation device so as to include: a control system for sequentially feedbacking measured values indicative of (i) a high frequency current of the high frequency power, (ii) a high frequency voltage of the high frequency power, (iii) a phase of the high frequency current, and (iv) a plasma condition (plasma density for example) in a vicinity of the load, and for independently and positively controlling the two or more loads in accordance with any one of phase modulation, frequency modulation, and amplitude modulation, so as to control impedance matching condition performed with respect to the load and so as to control uniformity and reproducibility of the plasma in the vacuum chamber; and a monitor showing the plasma condition.

In the high frequency power supplying device according to the present invention and the plasma generation device using the same, a single high frequency power source is provided so as to correspond to a load such as an antenna, and the high frequency power source independently drives the corresponding load, so that it is not necessary to supply high frequency currents to loads in parallel or in series.

Further, in the foregoing arrangement of the present invention, the high frequency current supplied to each load can be subjected to frequency modulation, so that it is possible to independently and positively control impedance matching condition for each load by using such property that an impedance of a capacitive load and a circuit element are in proportion to an inverse number of the frequency and an impedance of an inductive load and a circuit element are in proportion to the frequency.

Thus, according to the foregoing arrangement of the present invention, it is possible to reduce nonuniformity in high frequency voltages generated in the loads. As a result, even when a diameter and an area of the plasma generation section are made larger, it is possible to generate uniform plasmas, thereby stabilizing (i) formation of a thin film using a plasma and (ii) plasma ion implantation.

In addition, when the high frequency power supplying device and the plasma generation device according to the present invention use two or more loads, it is possible to independently control a frequency, a phase, and power of the high frequency power supplied to each of the loads, and it is possible to realize a control system, which controls uniformity and reproducibility of the plasma in accordance with the feedback control of the measured signal, by measuring and monitoring (i) a high frequency current, (ii) a high frequency voltage, both of which are applied to each load, (iii) a phase of the high frequency current, and (iv) a plasma condition in a vicinity of the antenna conductor. As a result, it is possible to stabilize (a) formation of a thin film using a plasma and (b) plasma ion implantation.

As described above, other plasma generation device of the present invention includes: a vacuum chamber for generating a plasma; at least one antenna conductor provided in the vacuum chamber so as to generate an inductive electric field when high frequency power is applied; and a first insulator disposed around a portion of the antenna conductor which portion exists in the vacuum chamber, wherein the plasma and the antenna conductor are prevented from being in contact with each other by a first space region intervening between the first insulator and the portion.

According to the foregoing arrangement, it is possible to more effectively and further reduce a high frequency voltage, applied to a region of a sheath region of the generated plasma, than that in a conventional arrangement by disposing the first insulator so that the first space region intervenes between the first insulator and the portion. Thus, it is possible to prevent the high frequency voltage applied to the region of the sheath region from raising a problem such as impurities caused by sputtering of the first insulator serving as a coating member, and it is possible to reduce the sputtering of the first insulator. As a result, it is possible to suppress nonuniformity and destabilization of the plasma generation which are caused by abrasion of the antenna conductor and the first insulator, thereby reducing the destabilization of the thin film formation using a plasma.

It is preferable to arrange the plasma generation device so that a second insulator is disposed around the first insulator so that a second space region intervenes between the first insulator and the second insulator.

According to the foregoing arrangement, by disposing the second insulator, it is possible to effectively reduce the high frequency voltage applied to the region of the sheath region.

It is preferable to arrange the plasma generation device so that: a grounding electrode surrounding the first electrode is provided on an antenna introduction section formed on the antenna conductor so as to be positioned in proximity to an internal wall of the vacuum chamber, and the second insulator is disposed around the grounding electrode so as to prevent the plasma and the grounding electrode from being in contact with each other.

According to the foregoing arrangement, by providing the grounding electrode, it is possible to prevent the high frequency voltage generated in an end portion of the antenna conductor from being applied to the sheath region of a plasma.

It is preferable to arrange the plasma generation device so that the grounding electrode has a zigzag structure in which the grounding electrode alternately protrudes in a direction orthogonal to a conduction direction of the antenna conductor so that a long axis direction of the grounding electrode corresponds to the conduction direction of the antenna conductor.

According to the foregoing arrangement, by arranging the grounding electrode so as to have the zigzag structure, it is possible to effectively shield capacitive coupling caused by the high frequency voltage generated in the antenna introduction section, and it is possible to enlarge a current path to the inductive electric field in the grounding electrode. As a result, it is possible to suppress heat generation induced by the grounding electrode and reduce power loss.

The plasma generation device may be arranged so as to include a sensor provided in the vacuum chamber so as to measure an intensity of a high frequency inductive magnetic field irradiated from the antenna conductor serving as a load.

The plasma generation device may be arranged so as to include a plurality of sensors provided in positions different from each other in terms of a distance from the antenna conductor.

The plasma generation device may be arranged so as to include a plasma control section for controlling a condition, under which the antenna conductor is driven, by calculating a plasma condition in the vacuum chamber on the basis of (i) a measurement result given by each of the sensors and (ii) a value of the high frequency current flowing in the antenna conductor.

The plasma generation device may be arranged so that the sensor includes: a magnetic field intensity detection section; and a first shield for covering the magnetic field intensity detection section.

The plasma generation device may be arranged so that the sensor includes a second shield for suppressing formation of an adhering substance on the first shield and for preventing the magnetic field intensity detection section from being shielded from the high frequency inductive magnetic field.

It is preferable to arrange the plasma generation device so that the second shield has a slit section for preventing the magnetic field intensity detection section from being shielded from the high frequency inductive magnetic field.

According to the foregoing arrangement, the high frequency magnetic field irradiated from the antenna conductor has a component, induced by the high frequency current flowing in the antenna conductor, mainly in an azimuthal direction with respect to an antenna current. Thus, the high frequency magnetic field intensity is measured so as to compare thus measured value with the high frequency current flowing in the antenna conductor (so as to calculate an intensity ratio, a phase difference), thereby directly measuring the high frequency magnetic field intensity which allows the inductively-coupled discharge to be driven in the plasma.

Thus, according to the foregoing arrangement, the measurement corresponds to a condition under which a driving source in the plasma generation is directly monitored. In generating a plasma, feedback control is performed so that the measured value is constant, thereby more favorably keeping the plasma generation condition constant.

The plasma generation device may be arranged so as to include a power source control section for controlling high frequency power sources so that spatial distribution patterns of plasmas each of which has been generated on the basis of pulse high frequency power supplied to each load are different from each other.

The plasma generation device may be arranged so that the power source control section periodically changes each of the spatial distribution patterns of the plasmas.

The plasma generation device may be arranged so that the power source control section independently changes each of the spatial distribution patterns of the plasmas.

The plasma generation device may be arranged so as to include a sensor provided in the vacuum chamber so as to measure an intensity of a high frequency inductive magnetic field irradiated from the load.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

In the high frequency power supplying device and the plasma generation device according to the present invention, it is not necessary to supply high frequency currents to loads in parallel or in series, so that it is possible to reduce unevenness in high frequency voltages generated in the loads.

As a result, even when a diameter and a volume of the plasma generation section are made larger, it is possible to generate much more uniform plasmas, so that it is possible to stabilize thin film formation process using a plasma and plasma ion implantation process. Thus, the foregoing arrangement can be favorably used to form a semiconductor thin film such as polycrystalline silicon.

The invention claimed is:

1. A high frequency power supplying device, having two or more loads which are capacitive or inductive, said high frequency power supplying device comprising:

high frequency power sources for supplying power to the loads, each of the high frequency power sources being provided in proximity to a corresponding load, wherein the proximity is such that a wiring length of the high frequency power source is set so as to avoid formation of a standing wave in each of the loads.

2. The high frequency power supplying device as set forth in claim 1, wherein
the high frequency power source has a high frequency power amplifier provided in proximity to a corresponding load.

3. A plasma generation device, comprising: the high frequency power supplying device as set forth in claim 2; and a vacuum chamber on which the loads are provided, wherein the high frequency power is applied to the loads so as to generate a plasma.

4. The high frequency power supplying device as set forth in claim 1, wherein
a frequency modulation control section for controlling frequencies of high frequency currents supplied to the loads is provided so as to cause the high frequency power sources respectively provided on the loads to independently and simultaneously supply the high frequency currents, identical with each other or different from each other in terms of a frequency, to the two or more loads, and so as to match impedances of the loads by performing frequency modulation with respect to the high frequency currents supplied to the loads.

5. A plasma generation device, comprising: the high frequency power supplying device as set forth in claim 4; and a vacuum chamber on which the loads are provided, wherein the high frequency power is applied to the loads so as to generate a plasma.

6. The high frequency power supplying device as set forth in claim 1, wherein
a phase modulation control section for controlling phases of high frequency currents supplied to the loads is provided so as to cause the high frequency power sources respectively provided on the loads to independently and simultaneously supply the high frequency currents, identical with each other or different from each other in terms of a phase, to the two or more loads.

7. The high frequency power supplying device as set forth in claim 1, wherein
a power control section for controlling high frequency power supplied to the loads is provided so as to cause the high frequency power sources respectively provided on the loads to independently and simultaneously supply one or more kinds of the high frequency power to the two or more loads.

8. A plasma generation device, comprising: the high frequency power supplying device as set forth in claim 7; and a vacuum chamber on which the loads are provided, wherein the high frequency power is applied to the loads so as to generate a plasma.

9. A plasma generation device, comprising: the high frequency power supplying device as set forth in claim 6; and a vacuum chamber on which the loads are provided, wherein the high frequency power is applied to the loads so as to generate a plasma.

10. A plasma generation device, comprising: the high frequency power supplying device as set forth in claim 1; and a vacuum chamber on which the loads are provided, wherein the high frequency power is applied to the loads so as to generate a plasma.

11. The plasma generation device as set forth in claim 10, comprising a measuring section for measuring (i) a high frequency current, (ii) a high frequency voltage, both of which are supplied to each of the loads, (iii) a phase of the high frequency current, and (iv) a plasma generation condition in a vicinity of the load.

12. The plasma generation device as set forth in claim 10, comprising: a negative feedback circuit for generating a control signal from a signal of the high frequency current flowing in the load; and a control system for self-oscillating based on the control signal so as to supply the high frequency power.

13. The plasma generation device as set forth in claim 10, comprising a plasma control section for independently setting phases and frequencies of high frequency currents supplied to two or more loads adjacent to each other, so as to control an effective acceleration potential of an electron in the plasma, the effective acceleration potential being caused by a high frequency electric field generated in the loads adjacent to each other.

14. The plasma generation device as set forth in claim 10, comprising:
a control system for sequentially feedbacking measured values indicative of (i) a high frequency current of the high frequency power, (ii) a high frequency voltage of the high frequency power, (iii) a phase of the high frequency current, and (iv) a plasma condition in a vicinity of the load, and for independently and positively controlling the two or more loads in accordance with any one of phase modulation, frequency modulation, and amplitude modulation, so as to control impedance matching performed with respect to the load and so as to control uniformity and reproducibility of the plasma in the vacuum chamber; and
a monitor showing the plasma condition.

15. The plasma generation device as set forth in claim 10, comprising a sensor provided in the vacuum chamber so as to measure an intensity of a high frequency inductive magnetic field irradiated from the load.

16. The plasma generation device as set forth in claim 10, comprising a power source control section for controlling high frequency power sources so that spatial distribution patterns of plasmas each of which has been generated on the basis of pulsed high frequency power supplied to each load are different from each other.

17. The plasma generation device as set forth in claim 16, wherein the power source control section periodically changes each of the spatial distribution patterns of the plasmas.

18. The plasma generation device as set forth in claim 16, wherein the power source control section independently changes each of the spatial distribution patterns of the plasmas.

19. The plasma generation device as set forth in claim 16, wherein:
the loads are divided into groups adjacent to each other, and
the power source control section causes the groups adjacent to each other to deviate from each other in terms of pulse operation.

20. The plasma generation device as set forth in claim 19, wherein
the power source control section causes the groups adjacent to each other to exclusively deviate from each other in terms of pulse ON/OFF operation.

21. The plasma generation device as set forth in claim 16, comprising a sensor provided in the vacuum chamber so as to measure an intensity of a high frequency inductive magnetic field irradiated from the load.

22. The high frequency power supplying device as set forth in claim 1, wherein the wiring length of each of the high frequency power sources is less than with respect to a wavelength of the high frequency.

23. The high frequency power supplying device as set forth in claim 1, wherein the loads are antennas.

24. The high frequency power supplying device as set forth in claim 23, wherein the antennas are independently driven and controlled such that a standing wave is avoided.

* * * * *